US010191176B2

(12) United States Patent
Keene et al.

(10) Patent No.: US 10,191,176 B2
(45) Date of Patent: Jan. 29, 2019

(54) DOOR ASSEMBLY FOR AN MRI ROOM

(71) Applicant: Metrasens Limited, Malvern (GB)

(72) Inventors: Mark Nicholas Keene, Malvern (GB); Simon Wray Goodyear, Welland (GB)

(73) Assignee: Metrasens Limited, Malvern (GB)

( * ) Notice: Subject to any disclaimer, the term of this patent is extended or adjusted under 35 U.S.C. 154(b) by 132 days.

(21) Appl. No.: 15/036,745

(22) PCT Filed: Nov. 13, 2014

(86) PCT No.: PCT/GB2014/053372
§ 371 (c)(1),
(2) Date: May 13, 2016

(87) PCT Pub. No.: WO2015/071672
PCT Pub. Date: May 21, 2015

(65) Prior Publication Data
US 2016/0306062 A1    Oct. 20, 2016

(30) Foreign Application Priority Data
Nov. 15, 2013    (GB) .................................. 1320232.0

(51) Int. Cl.
*G01V 3/08* (2006.01)
*G01R 33/28* (2006.01)
*G01V 11/00* (2006.01)

(52) U.S. Cl.
CPC ............. *G01V 3/08* (2013.01); *G01R 33/288* (2013.01); *G01V 11/00* (2013.01)

(58) Field of Classification Search
CPC ............ G01V 3/08; G01V 3/081; G01V 3/15; G01V 3/165; G01V 11/00; G01V 11/002; G01R 33/288; G01B 13/08; G08B 21/18
(Continued)

(56) References Cited

U.S. PATENT DOCUMENTS 7,633,518 B2 * 12/2009 Beevor .................. G01V 11/00
348/143
2004/0135687 A1 * 7/2004 Keene .................... G01V 11/00
340/551
(Continued)

FOREIGN PATENT DOCUMENTS

| EP | 0 097 139 A2 | 12/1983 |
| GB | 2 395 276 A | 5/2004 |
| JP | 2008-249584 A | 10/2008 |
| WO | 2012/022971 A2 | 2/2012 |

OTHER PUBLICATIONS

Search Report Under Section 17(5) dated Feb. 12, 2014, issued in priority GB Application No. 1320232.0, filed Nov. 15, 2013, 4 pages.
(Continued)

*Primary Examiner* — Jeff Natalini
*Assistant Examiner* — Steven Yeninas
(74) *Attorney, Agent, or Firm* — Christensen O'Connor Johnson Kindness PLLC

(57) ABSTRACT

An MRI room door assembly for use in protecting an entrance to a room containing an MRI scanner system. The assembly comprising a doorframe that is suitable to be fixed in position within or around an opening to the room, a door that is fixed to the doorframe, and an sealing arrangement that seals the door to the frame when it is at rest in the closed position and which is released as a user initiates an opening of the door. At least one or more of the door and the doorframe include a built in safety system which provides a function relating to preventing ferrous objects being brought unintentionally close to the MRI scanner system.

11 Claims, 16 Drawing Sheets

(58) Field of Classification Search
USPC ............ 324/244, 260, 207.26; 340/551, 552, 340/553, 554, 555, 556, 557
See application file for complete search history.

(56) References Cited

U.S. PATENT DOCUMENTS

| | | | |
|---|---|---|---|
| 2007/0132581 A1 | 6/2007 | Molyneaux et al. | |
| 2008/0001735 A1* | 1/2008 | Tran | G06F 19/3418 340/539.22 |
| 2010/0013461 A1* | 1/2010 | Masubuchi | G01R 33/288 324/201 |
| 2011/0057788 A1* | 3/2011 | Talkington | G08B 13/08 340/521 |
| 2012/0074943 A1* | 3/2012 | MacLeod | G01R 33/025 324/318 |

OTHER PUBLICATIONS

International Search Report dated May 26, 2015, issued in corresponding International Application No. PCT/GB2014/053372, filed Nov. 13, 2014, 5 pages.

Written Opinion of the International Searching Authority dated May 26, 2015, issued in corresponding International Application No. PCT/GB2014/053372, filed Nov. 13, 2014, 9 pages.

Notification of Reasons for Rejection dated Apr. 3, 2018, in Japanese Patent Application No. 2016-530993, filed Nov. 13, 2014, 6 pages.

Communication Pursuant to Article 94(3) EPC dated Mar. 19, 2018, issued in corresponding European Application No. 14799861.1, filed Nov. 13, 2014, 5 pages.

\* cited by examiner

DOOR ASSEMBLY FOR AN MRI ROOM

The present invention relates to door assemblies for use in protecting the opening to a magnetic resonance imaging (MRI) room.

MRI scanner systems are now commonplace in larger hospitals around the world. The MRI scanner is a machine that can be used to obtain medical images of the internal parts of a human body. At their heart is a chamber into which the patient can be at least partially placed, surrounded by an extremely powerful electromagnet. The electromagnet generates a magnetic field in the chamber.

MRI scanner systems, by necessity, have to be operated within RF shielded rooms (Faraday cages). These prevent external radio transmissions causing interference with the scanner's receivers thus degrading the images. People and medical equipment need to pass in and out of the shielded room regularly, so a door is required that is sealed to RF when closed to complete the shield. To achieve this, the door has to have a conducting sheet over its whole area and the door's frame must be conducting and electrically connected around its whole perimeter to the conductive sheet that is one wall the shielded room. Furthermore, the door must be electrically connected to its frame around its whole perimeter when closed. This connection between door and frame is called the RF seal.

When a door to an MRI room is closed there are no holes or gaps in the conductive shielding through which RF radiation can pass. The only exceptions to this are "feed through" units that are designed to allow electricity or gas tubes to pass through the wall but nonetheless block any RF signals. The door is sealed to the door frame by an RF seal.

There are two types of RF seal. The first type is manual and the operation of closing the door makes the electrical connection. These may be metallic sprung leaves or fingers that line the edge of the door and compress against the smooth metal inner surface of the door frame. There are other variations. The difficulty with these is that a lot of force is required to close the door in order to overcome the friction caused by the spring leaves compressing against the frame. Conversely, a similar force is required to open the door.

To overcome this doors with specially operated automatic seals have been devised. These doors may be easily closed, and when they reach the closed position a mechanism is activated that makes the RF seal. To open the door, the mechanism must release the RF seal first, then the door may be easily opened. One variation uses a metal braid tube with an internal inflatable bladder surrounding the door. To open and close the door the bladder is deflated. To make the RF seal, the bladder is pneumatically inflated forcing the metal braid tube to compress against the inner surface of the door frame. An alternative approach uses a flexible metal blade surrounding the door that is pushed outwards against the inner surface of the frame using pneumatic actuators. These automatic systems require an infrastructure of electrical and pneumatic systems within the door and frame. The seal/unseal operations may be controlled with micro-switches in the door or handle or by separate push switches mounted near to the door, inside and outside of the room.

For convenience, RF sealing doors suitable for use with MRI are referred to herein as MRI room doors.

Because of the RF seal mechanisms, MRI room doors are supplied as a door assembly comprising a door and a door frame together. Installation of the door assembly into the RF room shield requires mechanical attachment to supports and the electrical connection between the door frame and the conductive shield around the room. A drywall structure is then constructed around the shielded room, outside as well as inside, to produce a nice finish. An electrical supply for the system controlling the automatic seal is also usually provided.

An MRI facility may wish to have a safety system as well. The MRI scanner has a powerful superconducting electromagnet that can pull steel or other ferromagnetic objects into the system and cause a lot of damage. Ferromagnetic detection systems, FMDS, warn the person approaching or passing through the door that they are carrying or otherwise moving a potentially dangerous object.

FMDS are available separately from the door and are normally installed on the drywall structure surrounding the door frame of the MRI system room. Each FMDS must be carefully tailored to suit the shape and dimensions of the door.

Alternative safety systems such as barrier signs are also acquired and installed separately. These are light plastic warning signs that may be like saloon doors or motor controlled raising barriers. Again these are normally mounted on the drywall surround or on the floor nearby.

According to a first aspect the invention provides an MRI room door assembly for use in protecting an entrance to a room containing an MRI scanner system, the assembly comprising a doorframe that is suitable of being fixed in position within or around an opening to the room, a door that is fixed to the doorframe, and an RF sealing arrangement that seals the door to the frame when it is at rest in the closed position and which is released as a user initiates an opening of the door, in which at least one or more of the door and the doorframe include a built in safety system which provides a function relating to preventing ferrous objects being brought unintentionally close to the MRI scanner system.

Providing a safety system that is built into the MRI door assembly provides advantages over the prior art in which the doors themselves have no safety system built in and safety systems are installed in positions around the door after installation. These advantages may include ease of matching the safety system to the other characteristics of the door assembly as well as aesthetic and cost advantages.

The drywalls and architectural surroundings for an MRI door are highly variable. Safety systems, such as FMDS and barrier signs have previously had to be designed for flexible mounting to the walls adjacent the door assembly to accommodate this variability. Designing this flexibility into the equipment can add cost and compromise the performance of the safety equipment. For example, the sensitivity of an FMDS is poorer the further apart their sensors are. In some FMDS systems the sensors need to be located on either side of the MRI door so the drywall architecture may dictate a large separation, thus lowering the safety performance compared to one with a lower separation. Also there may not be space on the drywall structure for the equipment.

There are other significant disadvantages with separately installable safety equipment. The equipment requires installation by the hospital or by the equipment manufacturer, which is expensive. They constitute additional items in an environment that is already burgeoning with technical equipment.

The current invention overcomes these disadvantages by having one or more safety systems integrated into the MRI door assembly itself. The MRI door, frame, and safety system are built as a single product, completely removing the shipping and installation costs associated with the safety equipment. Furthermore, the safety system is ensured to be highly compatible with the door and fully optimized for performance by being independent of the surrounding drywall architecture. It will also be simpler, because features relating to the flexibility of installation are not required.

The safety system may be built into the door assembly prior to installation of the door assembly at the MRI room. They may be built into the door assembly "off-site" during the manufacture and testing of the door assembly.

In one arrangement, the safety system may comprise a ferromagnetic detection system (FMDS) arranged in use to warn a person approaching the door or having immediately passed through the door with a ferromagnetic object that they may be carrying a potentially harmful ferromagnetic object.

The ferromagnetic detection system may comprise a system having the features disclosed in U.S. Pat. No. 7,113,092, or as disclosed in WO2012/022971A1, the teachings of which are incorporated herein by reference.

The ferromagnetic detection system may in a basic implementation comprise a primary sensor means comprising one or preferably more passive magnetic sensors which detect the disturbances in the ambient magnetic field which occur as the object moves through the field and a secondary non-magnetic sensor means which detects movement of objects in a detection zone in the vicinity of the primary sensor means and a processing circuit which is arranged to monitor the signals from the sensors and to provide an alarm in the event that both the primary and secondary sensing means detect a moving object.

The function of the non-magnetic sensor means it to provide an indication of when an object is near to the door, so that the system is then able to check the magnetic sensors at that time to see if a ferro-magnetic object is present. By only checking when an object is in the defined range of the non-magnetic sensor means, false alarms which otherwise occur can be prevented.

An advantage of building the safety system into the door assembly is that it allows the designer significant freedoms in the design of the system. This is especially true for an FMDS system, where the applicant envisages many potential benefits of combining the door assembly with the FMDS system.

The secondary, non-magnetic sensor means may comprise at least one of a photo-electric sensor, a fibre-optic sensor, a passive infra-red sensor, a camera, an ultrasonic sensor, a radar sensor, an electrostatic sensor, and a millimeter wave sensor. By photo-detector we mean any detector which is able to detect incident photons, whether in the visible or non-visible spectrum.

In a preferred arrangement, the secondary sensor means may comprise a photo-detector and the door assembly may also include a light source which produces a beam of light that impinges on the photo-detector, the output of the photo-detector changing state when the light beam is broken, in which at least part of the path of the light beam defines the zone associated with the respective secondary sensor. Using light beams is a convenient and intuitive way of establishing the required zones of detection. The light source may produce a beam of light in the visible spectrum, or non-visible such as a beam of infra-red light.

The beam of light may be arranged to travel from the light source to the photo-detector by reflecting from a reflective surface. The reflective surface may be a retro reflector and the light source and photo-detector are located proximate one another.

For example where the door is an inwardly hinged door, meaning that it opens into the MRI room when installed, the light source may be located on the side of the door that the door swings away from and the photo-detector may also be located on that same side. The photo-detector may be fixed to one upright of the door frame and the light source fixed to the opposite upright of the door frame, or they may both be fixed to the same upright with a reflector being provided on the other upright so that the light passes twice across the door opening.

By fixed to the frame we may mean fixed directly to the frame or to a housing that is in turn fixed to the frame, or embedded partially or fully into the frame.

In this simple arrangement only one secondary sensor is needed and it is located outside of the MRI room where it is protected from the magnetic radiation in the room. An object entering the room will block the light beam so that the photo-detector no longer "sees" the light source. Normally the photo-detector will see the light source. This change provides the indication that an object is present.

In other arrangements, the door may be a hinged door that swings out from the room. In this case, the arrangement above will not work as the door itself will block the light beam when it is opened.

In this case of an outward opening door, the same light source and photo-detector may be used but instead of being located outside of the room they may be located inside of the room. Because the source and detector are built into the door assembly it is relatively easy to mount them inside the room with appropriate shielding. For instance, they may be connected to the signal processing circuit by cables that pass through feed throughs built into the doorframe. This would be very hard to achieve with a retro-fit FMDS system.

There may be occasions where it is not acceptable to locate the secondary sensor means inside the MRI room. In that case, the secondary sensor means may comprise a light source and a photo-detector which are fitted to the outside of the door assembly and a reflector may be provided on the inside of the door assembly, the photo-detector receiving light from the source that has passed through the door opening when the door is open and is reflected back onto the photo-detector from the reflector.

Typically, the door may be fixed to one upright of the frame by one or more hinges and the reflector may be fixed to that hinge-side upright, whereas the light source and photo-detector will be fixed to the door frame upright that is opposite the one with the door hinges.

When the door is open the light beam that passes across the door opening will normally illuminate the photo-detector but the beam will be broken if an object passes through the doorway, which can be used to raise the alarm.

In the arrangement of the previous two paragraphs some means for determining the position of the door may be included to prevent false alarms, the alarm not being raised if the door is closed. This is because the door itself blocks the beam when closed which would otherwise be indistinguishable for the beam being blocked by an object when the door is open.

The FMDS may therefore include a door position determining means which determines when the door has been opened sufficiently to clear the light beam.

The signal processing circuit may include a logical AND gate which combines the output of the secondary sensor means and door position determining means to produce an intermediate signal which has a first logical value when one sensor does not detect the presence of an object and the other determines that the door is closed, and a signal which has a second logical value when the secondary sensor detects the presence of an object and the door position determining means determines that the door is open, the signal processing circuit correlating the intermediate signal with the identified temporal variations in the measurement signal.

The door position determining means may comprise a door angle sensor which provides an output indicative of the angular position of the door. The secondary sensing means may be disabled when the door position is in a range that would block the light beam, and enabled once the door is open far enough for the light beam to hit the photo-detector.

The door position determining means may produce an output signal that changes state or value indicative of the relative position of the door to the door frame. For a hinged door this may indicative the angle of swing of the door. This door position determining means may be built into the door or the door frame or both. Where the door is connected to the frame by one or more hinges, it may be built into the hinge. A part of the sensor may form the hinge.

The door position determining means could be a photo-detector described above or an angular position sensor built into the door assembly such as a rotary encoder or linear encoder. A simple alternative is a mechanical or electronic switch that is activated when the door is at the required angle. It is preferable to avoid some electronic switches that require magnets to be placed on or in the door or frame due to the magnetic signals they produce.

The door position determining means may, rather than directly monitoring the door position, monitor the position indirectly. For example it may comprise a second light detector which detects light from a source when the door is closed, and which does not detect the light when the door is open sufficiently for the secondary sensor means to be operable. The output of the sensor therefore indirectly provides an indication of door position.

For example, where a secondary sensor comprising a photo-detector and door position sensor also comprising a photo-detector are provided, they may each comprise photo-detectors which detect the breaking of narrow defined light beams, each of the light beams may extend across the doorway from one side to the other. To get into the room through the doorway an object, such as a person, must break the beams. One of the beams may be reflected from a reflector located inside of the room such that with the door closed that beam is broken and with the door open that beam is not broken. The reflector may be secured to the doorway or the wall inside the room. Alternatively the reflector may be secured to the face of the door that faces into the room so that with the door open the light beam is reflected from the reflector to impinge upon the photo-detector.

For instance, rather than a door angular position sensor the system may include a second beam that it incident upon a second photo-detector with the door closed, the beam being broken when the door is opened. In this case the function of this second beam is only to determine whether the door is opened far enough that the first beam is not blocked by the closed door.

The sensors may be mounted onto the surface of the door frame, flush with the surface or may be recessed into the surface of the door frame. This may be done prior to installation of the door assembly. The magnetic sensors may be fixed to, or within the door, base or top of the frame. In an integrated system the magnetic sensors are not confined to either side of the door.

Building them into the door frame in this way has several advantages. The zone of sensitivity of each sensor can be set precisely relative to the position of the doorframe, and to match the size, shape and direction of movement of the door.

For example in the system of U.S. Pat. No. 7,113,092 the sensors must detect within a zone around the doorway. By building them into the door frame with the zones preset, all the fitter needs to do is fit the doorframe to the opening and not worry about setting up the sensors.

The processing circuitry for the sensors may be embedded within the doorframe or within the door or within a separate power supply box mounted in the ceiling. This allows the amount of the detection system that is visible from outside of the door to be minimised as the processing circuitry can be hidden within the door or door frame. This also helps protect the circuitry during installations.

In an alternative, the detection system or part of the FMDS detection system may be provided within a discrete housing which may be secured to the door frame. This may comprise an elongate hollow container, of rectangular cross section of hemi-spherical cross section for example. The housing may be provided with one or more holes through which fastenings can be passed to secure the housing to the door frame. These may comprise nuts or self-tapping screws. Corresponding threaded holes may be provided in the door frame when nuts are used as the fastenings.

The housing may be secured in position during manufacture and before or after installation of the door assembly at the MRI room. For example, it may be removed during initial installation to prevent damage and fixed in place on completion. The advantage of this is that the door assembly may then be universal, i.e. the same product can be used where the door is designated to swing into the MRI room in-swing), or swing out away from the MRI room (out-swing). It is preferable for the sensors to always be on the outside of the RF shield to avoid interference and the complication of having feed-throughs for the signals. This will also allow for easy maintenance.

By providing a housing which holds the sensors in known positions relative to each other and the frame, and providing means for fixing the housing in a known position on the door frame, it is possible to ensure the sensors are all pre-aligned before installation and suit the door and frame. This saves a lot of time when installing.

Where a housing is provided which can be removed, the housing may be provided with connectors that mate with corresponding connectors in the door frame, the mated connectors providing an electrical connection between electrical wiring or other parts in the door frame and the sensors in or on the housing.

Because the magnetic sensors are capable of sensing objects before they reach the door, the secondary non-magnetic sensor may be devised to sense people and equipment prior to the door so the ferromagnetic screening is complete before the door or its threshold are reached. Each sensor means may comprise a sensor and a processing circuit which processes the signals output from the sensor.

One or more of the sensors may be fixed to, or embedded in, one upright of the door frame or a housing as described above and one or more of the other sensors may be fixed to, or embedded in, the opposing upright of the door frame or a housing secured to the other upright of the door frame. Alternatively they may be secured to housings secured to the uprights of the frame.

The primary sensor apparatus may comprise at least two primary sensors, each sensor adapted to measure an ambient magnetic field or its gradient within a volume of space defined by a zone of sensitivity of the first and second magnetic sensors and to produce a corresponding measurement signal, the two sensors being secured in position with one on each side of a doorway.

An advantage of the invention, in at least one optional embodiment, is the ability to protect a doorway with an outward opening door whilst the primary and secondary sensing apparatus is located on, or adjacent, the doorframe.

The passive primary sensor apparatus may be duplicated so that there are two passive primary sensor apparatus, each comprising at least one, and preferably first and second magnetic sensors, and each passive primary sensor apparatus adapted to measure an ambient magnetic field or gradient within a respective volume of space defined by a first zone of sensitivity of the first and second magnetic sensors, and each producing a corresponding measurement signal. The measurement signals may be combined using an OR gate to provide an overall measurement signal. The respective first zones may be at least partially distinct, i.e. they may overlap but not be entirely coincident. This may enable a greater overall zone to be monitored, with only one of the primary sensor means needing to detect a ferrous object. Where there are more than two magnetic sensors, the primary sensing means is a magnetic sensing array. There is no upper limit to the number of sensors in this array other than the practical implementation and the cost.

The various component parts of the apparatus can be arranged in a variety of different ways. In one arrangement, two discrete units, which may be identical, may be provided. Each one may be identical, with each one including one or more passive primary sensor apparatus. Each one may include an input node for receiving a signal from the secondary sensing apparatus. Each unit may include a warning device, so that the warning device is duplicated. Each unit can be built into one upright of the door frame, by which we mean fixed, directly or indirectly, to the upright or embedded fully or partially into the door frame.

The, or each, magnetic sensor may separable from the signal processing circuit such that, in use, the at least one separable sensor may be disposed remotely to the signal processing means. Similarly the secondary sensing apparatus may be separable from the signal processing circuit and, optionally, the primary sensor apparatus. For instance the sensors may be fixed to the frame and the circuitry may be located within the door or preferably within the frame or within the power supply unit that may be located in the ceiling.

The signal processing means may comprise filter means arranged to substantially reject spurious variations in the measured magnetic field. The filter means may comprise a high-pass filter and in one convenient arrangement the filter may be responsive to the measurement signal produced by the primary sensor means to attenuate variations therein having a frequency of less than 0.2 Hz.

The filter means may additionally comprise a low-pass filter which may be responsive to the measurement signal produced by the primary sensor means to attenuate variations therein having a frequency of greater than 3 Hz.

The signal processing circuit may comprise means for comparing the amplitude of the output from the filter means with an adjustable threshold level so as to indicate temporal variations in the measurement signal due to the movement of a ferromagnetic object within an ambient magnetic field.

The applicant has appreciated that there is no need to raise an alarm when a person or object is leaving a protected area, such as an MRI room, and suppressing the alarm will in effect halve the number of times the alarm may operate when a person or object that is ferromagnetic passes through the doorway. Reducing the number of times the alarm sounds in this way may lead to an increase in safety as well as user satisfaction with the apparatus as alarms issued when a person is safely leaving a room are considered a nuisance.

Therefore, in one arrangement the safety system may comprise an FMDS in which the signal processing circuit is configured to identify temporal variations in the measurement signal due to the movement of a ferromagnetic object within the ambient magnetic field and to correlate the identified temporal variations in the measurement signal with instances in which the non-magnetic sensor means detects the presence of an object in its detection zone, and in which the signal processing circuit is arranged to cause the warning device to operate in the event that the correlation is indicative of the presence of a ferromagnetic object in the primary detection zone,
and further in which the signal processing circuit is adapted to determine the direction from which an object is approaching the doorway from the output signals from the non-magnetic sensor means and to modify the operation of the alarm dependent on the direction of approach.

The modification to the alarm may comprise suppressing the alarm completely, or partially. For instance if the alarm is both audible and visible, the audible part may be suppressed whilst the visible alarm is still issued.

The FMDS may therefore have a one-way capability such that it only triggers an alarm when people pass into the room and not when they exit. The coincidence or correlation between this signal and the magnetic sensor output determines the alarm condition. The advantage of this sensor determining the direction through the door is that some essential MRI equipment has some ferrous content, and could trigger an FMDS alarm, but not enough to be dangerous. By alarming only on entrance, extraneous alarms are cut by 50%.

Suitable direction sensing sensors may be optical twin parallel beams that detect the order their beams are broken, radar, ultrasound or other Doppler Effect devices, pressure pads and cameras. It is preferable that the direction sensing sensor means may also be used as the secondary non-magnetic sensor means.

The direction sensing non-magnetic sensor may in a position of use be arranged to detect an object approaching the doorway from within the protected area prior to the object being detected by the secondary non-magnetic sensor so that the alarm is suppressed whenever an object, such as a person, approaches the doorway from within the protected zone. This allows the alarm to be suppressed as an object or person leaves the protected zone. It may be built into the door or frame or a housing secured to the frame as discussed previously.

Logically, the alarm is arranged to be triggered if; there is a magnetic signal present above a threshold AND the secondary non-magnetic sensor means indicates the presence of an object AND the direction sensing sensor indicates that object is moving into the MRI room. Otherwise the alarm will not be triggered.

A preferred direction sensing sensor may be a pair of light beams with any of the configurations described earlier and arranged to be parallel to one another, typically separated by between 1 cm and 5 cm. This pair is arranged in a direction across the door frame so anything passing through the door will break them. They are set at a height above the floor that is greater than that which can be easily accidentally stepped over but not so high as to miss short equipment such as wheelchairs and equipment trolleys. Further, they are arranged with the two beams in a horizontal plane to insure that object entering or leaving the room break one beam prior the other. A simple processing means to determine the time order the beams are broken in is also required. This may have a 2-level logical output that outputs a 1 if the beams are broken in the order defining an object entering the room and a 0 if EITHER the beams are broken in the opposite order OR if neither beams are broken. This twin beam arrangement therefore acts as both the secondary non-magnetic sensor means and the direction sensing means.

In an alternative, the non-magnetic sensor means may comprise an ultrasonic sensor that emits ultrasonic radiation and detects reflected parts of the emitted radiation. It may comprise a radar sensor that emits radar waves and monitors a reflected part of the emitted waves. Using ultrasound or radar a single sensor may be used to both detect an object in a primary detection zone and detect the direction in which it is travelling based on the characteristics of the reflected signals. Typically these sensors rely on the transmission of short bursts of radiation which are then detected as reflections, the time of flight of the detected reflections being used to detect position. Using the well-known Doppler Effect the direction of travel may also be detected by looking at the frequency of the detected reflected part and correlating with the frequency of the associated transmitted signals. Such technology is well known in other applications, and as such the operation of the sensor will not be described here in any detail.

An optical sensor may be used to define the primary detection zone, and an ultrasonic or radar sensor may be used to detect an object approaching the doorway. Alternatively, a single sensor could be used to detect objects in the primary zone and detect an object approaching the doorway, either from within the primary zone or outside of the zone. A single ultrasonic or radar sensing apparatus may therefore define both a first and second non-magnetic sensor.

The signal processing circuit may comprise means for comparing the amplitude of the output from the filter means with an adjustable threshold level so as to indicate temporal variations in the measurement signal due to the movement of a ferromagnetic object within an ambient magnetic field.

The FMDS may further be arranged to distinguish between "safe" objects that can pass without raising an alarm and unsafe ones and alter the warnings accordingly. Thus, in a still further arrangement, the safety system may comprise an FMDS comprising:

identification means for identifying a person or object approaching the door assembly or having just passed through the door assembly, the signal processing circuit being configured to identify temporal variations in the measurement signal due to the movement of a ferromagnetic object within the ambient magnetic field and to correlate the identified temporal variations in the measurement signal with instances in which the non-magnetic sensor means detects the presence of an object in its detection zone, and in which the signal processing circuit is arranged to cause the alarm to operate in the event that the correlation is indicative of the presence of a ferromagnetic object in the primary detection zone but to modify the operation of the alarm according to the identity of a person or object identified by the identification means.

The FMDS may include: a memory which stores one or more identity codes corresponding to respective identities of transducers, and an RF receiver which is adapted to receive an identity signal from a transducer when the transducer is within a detection zone, in which the system identifies people or objects by detecting RF tags that they are carrying form the codes in the memory.

The RF receiver may comprise a RFID tag reader, and the transducer radio frequency identify tags (RFID tags). The inventors appreciate there are many variations of RFID system that operate between Low Frequency (LF) and ultra-high frequency (UHF) radiation, and may have a detection range of between 1 cm to 10 m.

The RF receiver may be built into the door or door frame. The processing circuit and memory may be built into the door or door frame. Again, the receiver or memory or circuit could be built into a housing secured to the door frame as described above for other arrangements.

The modification to the operation of the alarm may comprise suppressing the alarm if the presence of an RFID tag of a known identity is detected by the RFID receiver.

The signal processing circuit may suppress the alarm for a defined period of time sufficient to allow a person to move through the doorway entering and then leaving the detection zone of the first sensor apparatus.

The delay may be from 10 seconds to 30 seconds. It is preferred that the delay is kept as short as possible. This can be achieved best by arranging for the RFID receiver detect an object approaching a very short distance prior to the second sensor being triggered.

In an alternative the period of time need not be predetermined, and the signal processing circuit may suppress the alarm until such time as the object has entered and then left the detection zone of the first sensor apparatus.

In a refinement, rather than suppressing the alarm the system may modify the threshold at which an alarm is triggered as a function of the magnitude of the temporal variations in magnetic field detected by the magnetic sensor when a known RFID tag is detected.

For example, the memory may store alongside each identity in the memory a value indicative of a ferromagnetic profile associated with an RFID tag, the profile being used by the apparatus to set the threshold level of change of magnetic field which may trigger an alarm. The circuit may look up the value and trigger and raise an alarm accordingly.

The memory may allocate one of a set of predefined thresholds. For instance, some tags may be associated with a low threshold so that the sensitivity of the system is relatively high, an alarm being raised if a weakly ferromagnetic (or smaller but relatively more ferromagnetic) object is passing. Other tags may be associated with a higher threshold so that larger objects can pass without raising an alarm. Some tags may be associated with a value that suppresses the alarm completely if the tag is detected.

As well as allocating a threshold for each tag, the memory may also store information indicative of a desired duration for the suppression associated with each tag. The signal processor may then apply the suppression for the time stored in the memory. Once that time has elapsed, if the tag is detected the alarm may be raised (not suppressed) if the conditions are met. It is appreciated that for some large pieces of equipment it may take a long time to move through the doorway and so a long time of suppression is needed. For smaller items, such as personal clothing, it can be expected they will move quickly through the doorway so a shorter time of suppression is appropriate. Clearly, the shorter the time in which the alarm is suppressed the less the chance of other, unidentified but potentially dangerous, items being allowed to pass without an alarm being raised.

The apparatus may therefore include at least one RFID tag which can be allocated to a person who is to pass through the entrance, or can be stuck to, embedded into or otherwise attached to an object that might move through the protected entrance.

The apparatus may further include one or more ferromagnetic objects which have attached thereto an RFID tag, that identity of the RFID tag being stored in the memory of the apparatus. Most preferably the memory also stores a value alongside the identity which corresponds to the ferromagnetic profile of the object.

Instead of an RFID system, or as well as that, the detection system may instead include a barcode scanner that is arranged to scan barcodes or other pattern recognition features issued to trusted employees or to trusted equipment. Again, this may be built into door assembly, and a memory may store details of trusted barcodes.

Other alternative devices may be incorporated into the door assembly for verification of trusted employees who can pass with modified triggering the FMDS system. For instance, face recognition, video tracking, thumb-print or other biometric sensor may be provided.

MRI doors contain ferrous parts, in particular the hinges, handles, and locks, fixings etc. FMDS detect moving magnetic objects and will easily detect the MRI door, which is the major cause of false alarms in conventional FMDS. A door may be devised that has all non-magnetic fittings and structure. However, the eddy currents generated by the dynamo effect due to the conducting layer moving in the magnet's fringe field will be magnetic. To overcome these, normally the MRI door has to be stationary when people pass through. The applicant has appreciated that an alternative solution is possible as long as the FMDS is capable of ignoring door movement. The latter is preferred because workflow through the door is an important consideration and the FMDS will not appear compatible if the door causes alarms.

US patent application US 2012/0074943 A1 and GB patent application number 1219097.1 teach FMDS with door ignoring capabilities. In a preferred embodiment, an MRI door assembly of the present invention may incorporate either approach. The teachings of those documents are therefore incorporated herein by reference.

In a still further arrangement, the safety system comprises an FMDS comprising:
a door position determining means which is adapted to monitor the angular position of the door, and
in which the signal processing circuit is adapted to modify the operation of the alarm in the event that output of the door position determining means indicates that the door is moving.

The apparatus may modify the operation of the alarm by suppressing the alarm if the door is moving, or if the door is moving and one or more conditions are met.

Whilst suppressing the operation of the alarm if the door is moving removes the chance of false alarms being generated, it does leave the possibility that a ferromagnetic object may pass through the door as it is opening. It is undesirable in such an event for the alarm to be fully suppressed.

Therefore, in a refinement the apparatus may not fully suppress the alarm if it is moving but instead alter the threshold at which an alarm is raised according to the position at which the door is located and/or the rate at which the door is opening or closing. This allows the magnetic effects caused by the door to be compensated for.

The duration of the suppression of the alarm may be controlled by the signal processing means. A user operable input (such as a switch or button) may be provided which enables the user to turn the suppression on or off as required. For example, the apparatus may be set so that the suppression of the alarm never happens, a so called override mode, or set so that the alarm is suppressed when the door opens/closes.

In a further refinement the apparatus may include a memory which stores historical data information about the change in ambient magnetic field in the zone of sensitivity of the magnetic sensor, and in the event that the output of the door position sensing means indicates that the door is moving at the same time that the second sensor indicates the presence of an object in the first detection zone, the apparatus is arranged to cause an alarm to be raised if the stored historical data indicates that the ambient magnetic field was changing prior to the start of the movement of the door.

The historical information may be obtained by sampling the output of the magnetic sensor periodically.

Looking back to a time just prior to the door moving to see if the magnetic field was changing provides a good estimate of whether a ferromagnetic object was close to the door, and the raising of the alarm is made on the assumption that the same object that is in the detection zone of the non-magnetic sensor means when the door is moving is the same ferromagnetic object as was detected. This may lead to the occasion false alarm, but this may be preferable to a completely suppressed alarm.

In a refinement, the signal processing circuit may be adapted to compare the stored historical data with baseline data and information indicative of the position of the door to remove from the data the effect of the movement of the door, and in the event that the correlated data indicates the presence of a moving magnetic object in the detection zone of the magnetic sensor may reactivate the alarm.

This may allow data to be used that was recorded even when the door was moving, rather than looking back at historical data obtained from a time before the door started to move.

The apparatus may store the baseline data in memory. This data may be actual data obtained during installation of the apparatus as the door is opened and closed and the output of the magnetic sensor is sampled. At the same time the output of the position sensor may be sampled and stored together with the magnetic data. Each door might produce a unique variation in the magnetic field, and by storing this in memory it can be "subtracted" from the observed change to allow the effect of movement of the door to be removed from any correlation used during the raising of an alarm.

The door position sensing means may comprise a rotary encoder that connects the door and the door frame. It may comprise an optical sensor having a source and detector secured to the door or relative to the frame, and a reflector which reflects light from the source onto the detector, the sensor determining the distance between the detector and reflector. It may comprise an infra red or ultrasonic distance measurement sensor, linear encoder, potentiometer sensor, strain gauge, camera, pneumatic bladder with pressure sensor.

The door position determining means may use infrared light. It may be combined with the non-magnetic sensing means as a single sensing device. For example, an ultrasonic sensor or radar sensor may detect the presence and movement of objects in the vicinity of the door, including being sensitive to the position of the door. This can be achieved provided the door and the primary detection zone are in the field of view of the sensor. The sensor may also determine whether the door is moving or stationary.

In a still further arrangement, the FMDS may comprise:
a door position determining means which is adapted to monitor the angular position of the door relative to a door of the entrance, and
and further comprising a memory which in use stores historical temporal variations in the measurement signal due to movement of a ferromagnetic object within the ambient field, and correlation means which is adapted to correlate the stored historical temporal variations in the measurement signal prior to the door moving with incidences in which the non-magnetic sensing means detects the presence of an object in its detection zone, and in which the apparatus is arranged to cause the warning device to raise an alarm in the event that the correlation, albeit separated in time, is indicative of the presence of a magnetic object in the vicinity of the magnetic sensor.

The door positioning determining means may comprise a position sensor as described herein before. However instead of a door position sensor, or as well as a door position sensor, the door may be provided with a user operable release mechanism, such as a door handle, and a release signal sensor that indicates that a user has operated the release mechanism.

The release mechanism may be the door latch, or a seal which is engaged when the door is closed and must be released before the door can start to open.

The FMDS may receive the signal from the release mechanism sensor and use the output from the release signal sensor to determine which historical data to use in the correlation. This may be used instead of a position determining means so that, rather than detecting movement of the door the system relies on an indicator that the person is likely to be about to move, to give an earlier notice of the likely opening event. Looked at another way, the monitoring of the door release mechanism may be considered to provide a reliable indirect measurement of the current and future door position.

The door release mechanism may provide an input to an automatic seal mechanism for the door, or may trigger the release of a door latch that secures the door.

The door handle may be fitted to the door. Alternatively a push button release may be provided on the door, the door frame or for securing adjacent the door frame. If it is located next to the door frame wires will be needed to connect to the automatic release means or a wireless connection will be needed.

The FMDS system, where fitted, may be arranged to monitor the output signal of the release signal sensor or the door angle sensor or both and to modify the operation of detection system according to the value of the signal. For example, upon detecting that the handle has been operated the FMDS may set a time indicating the end of the period of historical data that is to be used which will typically be earlier than the time from which the door starts to move. This is because there is usually a delay between a person pulling or pushing the door handle and the door starting to move. When the door handle is being moved there may be some change in the magnetic field, which would give a false suggestion that there is a ferro-magnetic object near the door if the historical data included the time that the door handle is moving.

Use of the door release signal by the FMDS may therefore be advantageous when compared with use of a door position signal because it provides an earlier indication that the door may be about to open. The door position signal only indicates that it has started to open. This earlier warning can be used to advantage by the FMDS in the way in which it performs the temporal correlation of signals.

The FMDS system may be linked into to a door lock mechanism fitted to the door, so that it is able to operate the door lock to prevent the door being opened in the event that a ferromagnetic object is detected and the door release mechanism has been operated. Because this is triggered by the door handle operating, and prior to the door moving, the door can easily be locked.

The signal processing circuit of the FMDS may include means for the adaptive tracking of door position from monitoring the door position signal to allow dynamic adjustment of the thresholds of the signals from the magnetic sensors that are used to trigger an alarm. This is squelching the system's sensitivity whilst the door is in motion. The system learns the door magnetic signal from the magnetic sensors and door angle sensor. It applies a dynamic threshold that follows the door signal so that the threshold is always above the level at which the door would trigger an alarm but close to that level. A memory may store a map of magnetic field against door position, for instance, that is unique to the door or to a type of door to which the FMDS is to be built in.

The FMDS may also, or instead, learn the characteristics of the door during use, so that it will adaptively track changes in the behaviour of the door.

One of the advantages of an integrated door and FMDS is that if necessary, electrical components may be on the inside of the shield, inside the MRI room, and use convenient feed-through filters to maintain RF integrity. Door position sensors include but not confined to rotary potentiometers, rotary encoders, linear encoders, optical, magnetic, inductive and capacitive sensors.

The safety system built into the door assembly may therefore include one or more sensors or warning devices that are located on the side of the door that will in use be inside of the MRI room, connected to circuitry located outside of the doors RF shield through suitable feed through filters built into the door assembly. Although not explicitly stated the skilled person will understand that the door will include an RF shield that is connected to the door frame through the automatic seal.

The door frame may comprise a stainless steel or aluminum pressing, extrusion or molding, and may include means for fixing the frame to an RF shield that extends around the MRI room.

The FMDS or other safety system may include a warning device which may be built into the door assembly.

The warning device may comprise one or more light sources. For instance, a light source that emits green light may be illuminated by the FMDS safety device if it is safe to pass through the open door, and a light source that emits red light may be illuminated if it is not safe to do so. One light source that can change color, say from red to green and vice versa, could be provided.

The or each light source may be built into the door or the door frame or both, or secured to a part that is in turn secured to the door or frame.

The light source may comprise a device which projects an image into a space in front of the door and downward onto the adjacent floor inside of the MRI room when the door assembly is installed in its final position of use. This light source may project a warning signal onto the floor inside of the room. The warning sign may comprise a light pattern of a specific color, such as red, if a warning is issued, or a specific pattern such as an exclamation mark or some text, e.g. "Stop".

The light source may comprise a light projector.

Projecting the signal into the room is beneficial where the safety system is built into the door assembly. If a light is fitted to the door or frame, and a person rapidly approaches the door when the door is open, they may be level of past the door by the time the visual alert is issued. It may then only be in their peripheral vision or may be in their blind spot. As such it may not be a very effective deterrent. On the other hand, if it is projected into the room it is easily visible ahead of them as they start to pass through the doorway. It can therefore be far more effect as a deterrent.

In an alternative to the projection of a warning, the light source may emit a visible signal that is displayed in the MRI room at the end of a stalk that extends from top of the door frame into the MRI room. Of course, it need not be right at the end of the stalk, the stalks function being to support the visible light at a distance from the door frame inside the room. The light should face the door frame so it can be seen as a person enters the MRI room.

The stalk may therefore protrude into the MRI room from the top of the door frame and has one or more lights facing backwards and downwards so they can be seen by someone at the threshold.

The light source may be fitted to the stalk at a distance of 10 cm, or 30 cm, or more than 30 cm from the doorframe.

Alternatively the light source may be fitted on or in the door frame and emit light that is carried to the end of the stalk by a light pipe or one or more optical fibers to exit the pipe of fibers at the distant end of the stalk. This may be easier to construct as it allows the source and the drive circuitry to be located outside of the shielded room and shielding of the door and frame, with only the light passing through the shielding into the room.

In another arrangement the light source may be fitted to the door assembly so that it causes the colour of a door release mechanism, such as a door handle or release button, to change colour. For example, the door handle may change colour from green when there is no warning to red. Other colour changes are possible.

The light source may illuminate the door handle from inside the handle so the handle itself glows, or may project light onto the handle exterior. It may be located in the door or frame adjacent the handle.

Causing the handle to change colour is beneficial as the person opening the door will usually be looking at the handle to grasp it, so they are certain to spot the colour change.

The door assembly may include a display screen upon which the visible warning is displayed.

The display may be switched on or off as the door is opened or closed.

The display may have a system of LEDs or other illuminating means that indicates the output of the magnetic sensors. For example, a bar graph display may rise and fall with the immediate magnetic measurement to indicate to people approaching the door if they are carrying a ferromagnetic object before they reach the door. This may provide an early warning to people approaching whilst carrying ferromagnetic objects.

The display may indicate the position or zone that the detected object is in. This could be an illuminating graphic on a display or a system of lights that are arrayed around the frame. It is straightforward and well known in the art to determine the zone of a ferromagnetic object from the magnetic data and output to a visual display.

Other warning devices that could be used include a sounder for an audible warning.

The safety system may include means for modifying the sound of the alarm that is issued, or the form and colour of any visual alarm according to one or more environmental parameters such as the time of day or night or the day of the week, and may change the warning according to whether the door is open or closed. For example the warning maybe a harsh loud alarm for out-of-hours and softer during operating hours.

The door assembly may include a safety system which includes a display screen on which safety information can be displayed when in use. This may be fitted onto or into the door or frame, or to both (two screens).

The safety system may include a signal processor for generating information to be displayed on the screen. This may be passed to a video driver to produce the required information as images on the screen. Messages may include the status of the door (locked or unlocked, fully closed or open), the service status of the door (service required, service due in X days, service overdue) and the service status of the safety system.

The safety system may be connected to the same electrical supply as the automatic seal, so that only a single wiring connection needs to be made during installation. This is much quicker and easier than the wiring for separate door assemblies and retro-fit safety systems.

The safety system may comprise a barrier which is fixed at one end to the door frame and the other end of which can be moved to a position in which it obscures at least partially the entrance to prevent entrance or egress from the room.

The barrier may comprise an arm. It may be a swing arm, swinging vertically or horizontally, or an extending arm. The arm may be spring loaded.

The barrier may comprise a screen or curtain, or the barrier may comprise a chain or rope.

The barrier may be automatically operated or manually operated. Where it is automatically operated it may be driven by an actuator which is built into the door or frame, a processing circuit being provided which supplies drive signals to the actuator. The processing circuit may receive signals from an FMDS where provided or from a door release signal sensor where provided or a door angle sensor where provided. For instance, when the sensor indicates the door is open the actuator may be caused to move the barrier to block the doorway. Where it is manually operated it may have switches on both sides of the door frame. Alternatively, it may have a remote control unit that is carried and operated by staff.

The barrier should be configured so that a person can break though the barrier in an emergency.

The barrier may comprise two parts, each secured at one end to a respective side of the door frame, the ends of each part being movable.

The two parts may swing between open and closed positions similar to a traditional saloon door.

The barrier may include a sign, such as a warning sign.

In another arrangement, the safety system may comprise a camera which has a field of view that that in use enables it to monitor the movement of people towards the door from outside of the room.

This may comprise a camera that is fitted onto or into the doorframe above the door. It may be secured to a boom that projects from the door. The boom may be secured to the wall or wall surrounding the door and connected to processing circuitry that is built into the door or door frame.

In use the camera may have a field of view that observes an area in front of the door and outside of the MRI room. For example, where the door is an outward opening door it may observe the area through which the door swings when opened.

The camera may have a relatively wide field of view so that it can observe an area both outside of the MRI room and inside of the MRI room at the same time when the door is open.

The camera output may be connected to a processing circuit that is built into the door assembly. Transmission means may be provided for transmission of the images captured by the camera to be transmitted to a display located at a remote location such as a control room.

The output of the camera may be input to the FMDS system. The camera may replace or supplement the non-magnetic sensors of an FMDS system providing the indication that an object is in the vicinity of the door, the magnetic sensor or sensors then being used to decide if the object is ferromagnetic.

Providing a camera may also enable the FMDS to tailor the sensitivity of each of the two magnetic sensors where one is provided on each side of the doorway to ensure that the system has a proportional sensitivity to ferromagnetic objects regardless of where they are located relative to the frame of the door. For instance, if the camera shows the object is close to one sensor, the sensitivity of that one may be reduced relative to the sensitivity of the other sensor that it is further away from. This can be used to compensate for the highly non-linear response of the sensors with range to a ferromagnetic object.

In another arrangement, that may be combined with any of the above concepts, the MRI door system may include a storage chamber which is secured to a part of the doorframe and which includes a lid which may be secured in a closed position. This chamber would be on the inside of the frame as a safe and visible place to keep the patient's locker key, that may be ferromagnetic.

The lid may be transparent to allow the contents of the container to be visible at all times.

The door assembly may include many other safety systems as follows. These may be instead of or in addition to any of those described herein before.

The FMDS system may include means for determining that an object that has been detected is a bra under-wire or wires and may be adapted to null or squelch any alarm accordingly. The applicant proposes this may be based upon an RF absorption or radar technique which detects the signature signals corresponding to objects shaped like a bra underwire.

The door assembly may include an Ethernet connection for outputting statistics gathering on the door and the safety system by the door's processor. For example, the door assembly may include a counter which in use counts the opening and closing of the door, and a memory may be provided in which the count information is stored.

The door assembly may include a damping system to prevent the door from drifting slowly when opened and left open, or a detent system which holds the door open in a set preferential position, and the FMDS system may be tuned to the characteristics of the door when held open in this known position. Thus, any effect of ferromagnetic parts of the door on the detection can readily be compensated if the position is known.

The door assembly may include a totally Non-ferrous or zero magnetic door.

The safety system may comprise a magnetic pre-screening system which is suitable for use in scanning a patient for ferromagnetic objects before they are allowed to enter the room. Pre-screeners must be able to detect even the smallest ferromagnetic items on a person because they will be placed inside the MRI scanner system. Having a pre-screener built into the door may be used to great advantage compared with providing a separate standalone pre-screener system.

The safety system may, in one advantageous arrangement, comprise a combined FMDS system of the kind described above and a pre-screener system, the combined system comprising one or more magnetic sensors that are common to the FMDS and pre-screener system and means for raising the sensitivity when in the pre-screener mode and lowering it when in the FMDS mode.

Therefore, the door assembly include circuitry that in use causes the primary magnetic sensors means of the FMDS to be driven in an FMDS mode with a first sensitivity or in a pre-screener mode with a second sensitivity higher than the first.

The safety system may be arranged so that the pre-screener, or the pre-screener mode of a combined FMDS/Pre-screener, can only be activated with the door closed. It may automatically be activated when the door is closed. When the door is opened, it may automatically revert to its FMDS entryway sensitivity.

Alternatively, there may be a button to evoke the high sensitivity screener mode and EITHER opening the door OR pushing the button again return it to entryway mode.

The automatic seal and the safety system may share a common signal processing circuit, and may be fed with power from a single supply by a single connector. The signal processing circuit or circuits may be located with the door, on the side of the RF shield that faces away from the MRI room when installed.

The door or frame may include an access panel which permits the signal processing circuit to be accessed for servicing without having to remove the door from the frame.

The automatic seal may comprises one or more actuators such as electromagnets or hydraulic rams that may be driven by a signal processing circuit. The circuit may receive a signal from a door handle sensor and optionally a door position sensor. The signals from these sensors may be shared with the safety system, reducing the need to duplicate the sensors.

The skilled person will understand that many of the inventive concepts described above can be implemented without them being built into a door assembly.

Therefore, according to a second aspect the invention provides a ferromagnetic warning system for use in protecting a door of a room containing an MRI scanner system, the system comprising:

passive primary sensor apparatus comprising first and second magnetic sensors, the primary sensor means adapted to measure an ambient magnetic field or gradient within a localized volume of space defined by a first zone of sensitivity of the at least one magnetic sensor, and to produce a corresponding measurement signal, signal processing circuit arranged in communication with the primary sensor apparatus, and a warning device operable by an output from the signal processing circuit, the warning device adapted to display a warning inside of the MRI room so that it is visible to a person who has passed through the doorway and is facing forward.

The FMDS may include secondary non-magnetic sensor apparatus comprising at least two sensors, each one being adapted to detect the presence of objects within a respective zone in the vicinity of the primary sensor apparatus, the zone for one of the secondary sensors being distinct from the zone of the other one of the secondary sensors, the sensors being arranged so that as the door moves from fully closed to fully open it passes through both of the zones of the secondary sensors but is only ever detected within one zone for any given position of the door, the signal processing circuit being arranged in communication with the primary and secondary sensor apparatus.

The FMDS may include any of the features of the FMDS devices described in this application.

The warning device may project the warning into the room as a pattern of light. It may comprise a light source that projects the warning downward at a normal vertical angle from light source into the room. It may project it down onto the floor between 50 cm and 2 m into the room, or more than 2 meters.

It may instead project the warning straight ahead or even to the sides or upwards, where it will illuminate walls or the ceiling or any objects in the room.

In a modification, the light source may be located inside the room, such as on or in the ceiling or floor.

According to a third aspect the invention provides a ferromagnetic warning system for use in protecting a door of a room containing an MRI scanner system, the system comprising:

passive primary sensor apparatus comprising at least first and second magnetic sensor, the primary sensor means adapted to measure an ambient magnetic field or gradient within a localized volume of space defined by a first zone of sensitivity of the at least one magnetic sensor, and to produce a corresponding measurement signal, secondary non-magnetic sensor apparatus comprising at least two sensors, each one being adapted to detect the presence of objects within a respective zone in the vicinity of the primary sensor apparatus, the zone for one of the secondary sensors being distinct from the zone of the other one of the secondary sensors, the sensors being arranged so that as the door moves from fully closed to fully open it passes through both of the zones of the secondary sensors but is only ever detected within one zone for any given position of the door, signal processing circuit arranged in communication with the primary and secondary sensor apparatus, and a warning device operable by an output from the signal processing circuit, and further comprising warning modification means for monitoring a release signal issued by a part of the door assembly that indicates that the door is likely to be opened, and to modify the warning on receipt of the release signal.

According to a fourth aspect the invention provides a door assembly according to the first aspect of the invention installed at an entrance to an MRI room.

The door assembly may include one or more safety systems which produce safety signals that are fed to a remote monitoring room where they may be monitored.

There will now be described, by way of example only, four embodiments of the present invention with reference to and as illustrated in the accompanying drawings in which.

Figure 18:
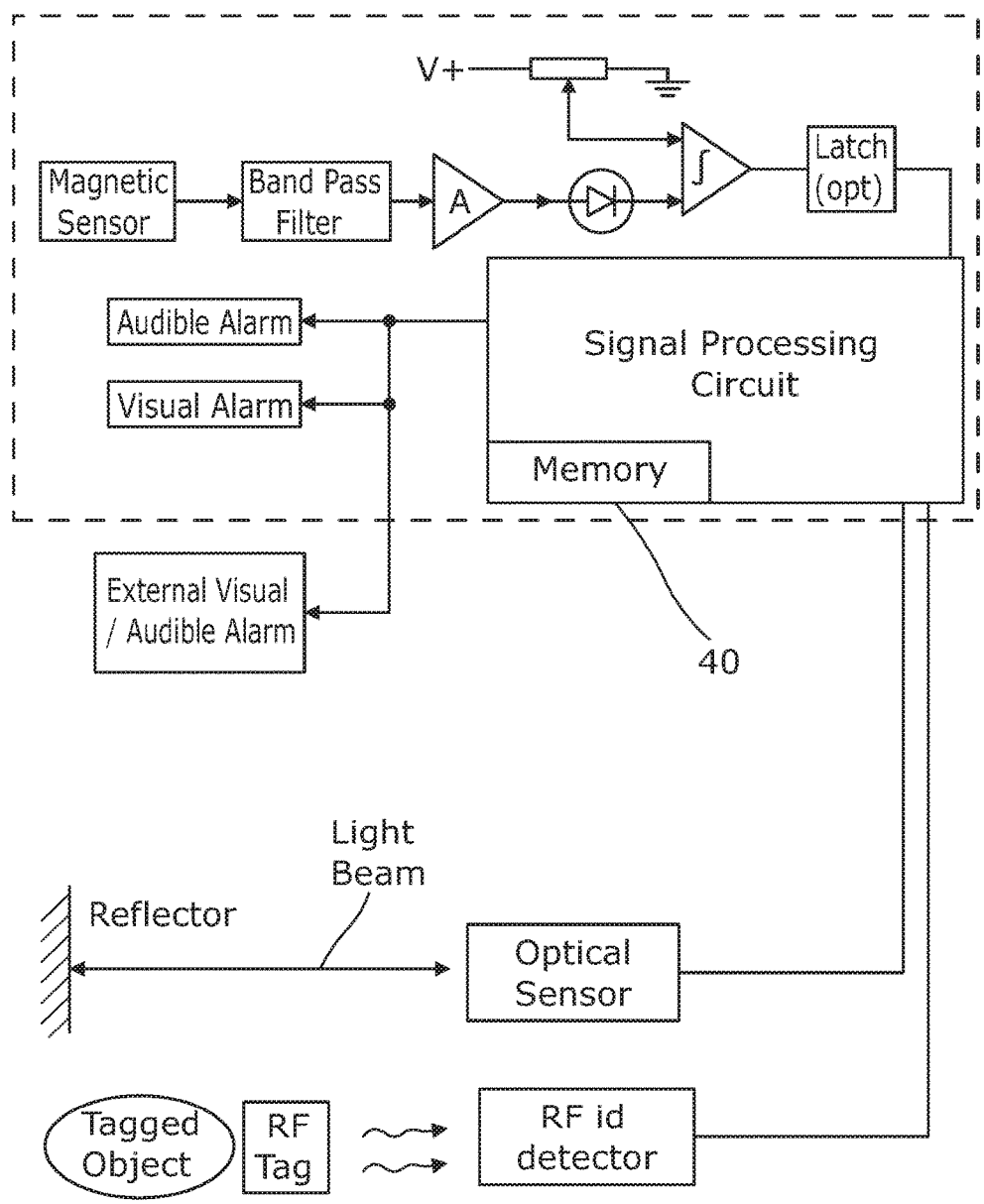
Figure 19:
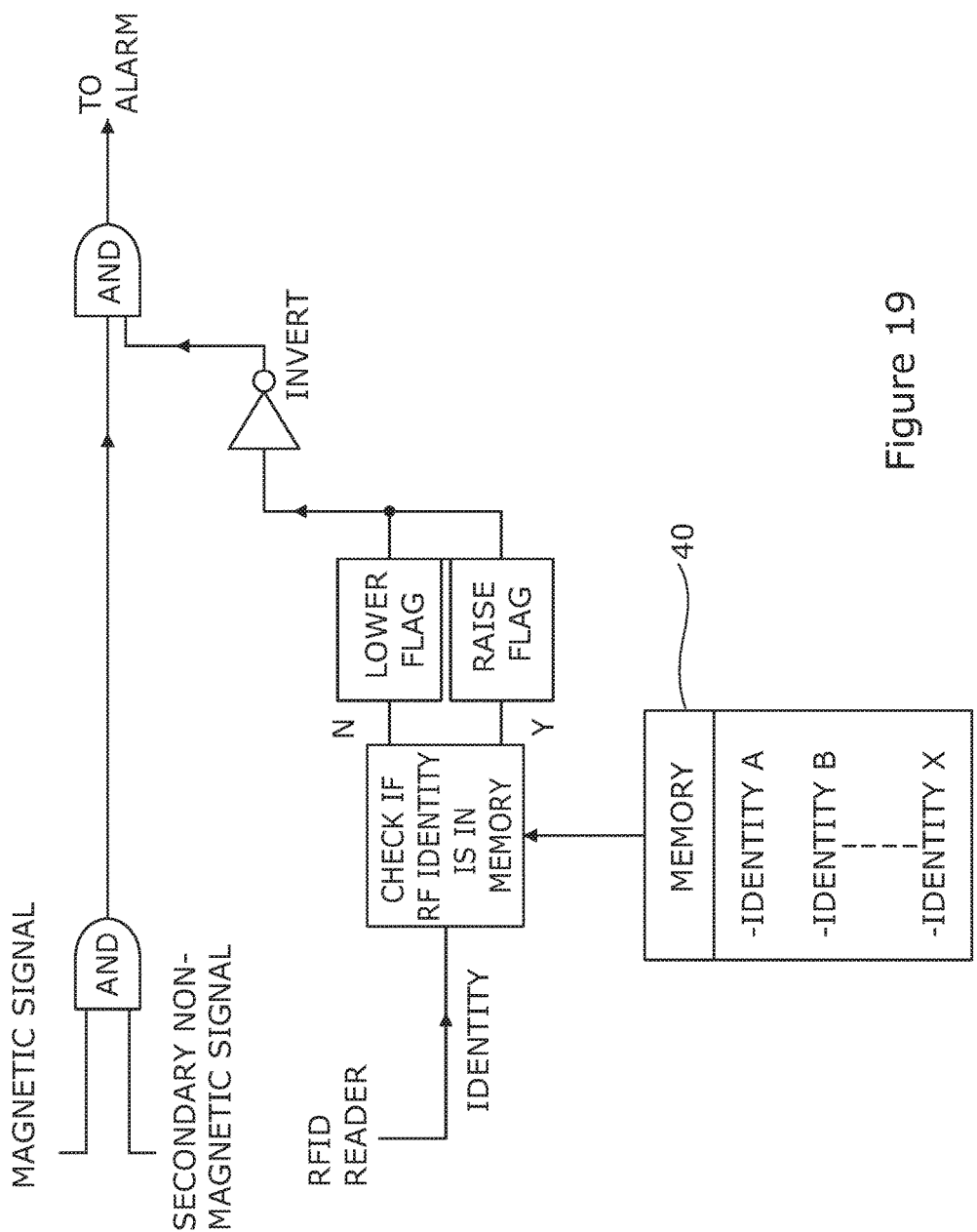
Figure 20A:
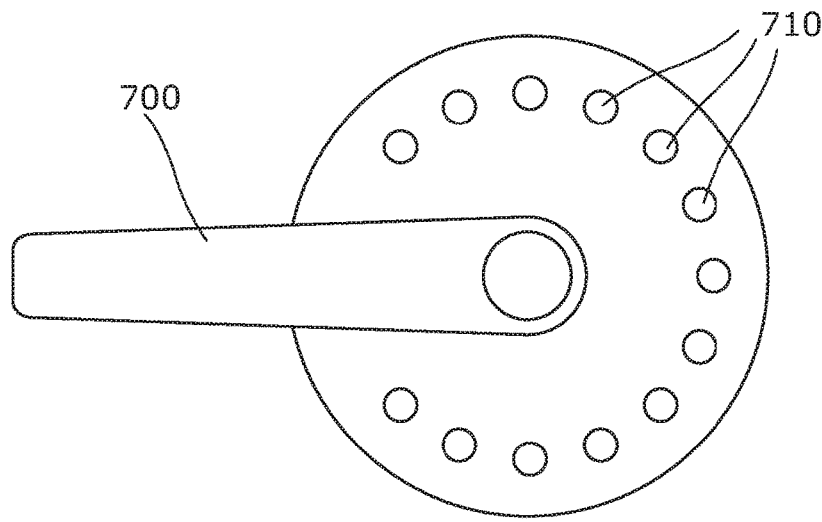

FIGS. 17(a) to (d) show various barriers that can be built into an MRI room door to form a safety function;

FIG. 18 is a schematic of an further alternative FMDS that can be built in to an MRI room door and that include an RF id detector;

FIG. 19 shows the processing logic that may be applied by the signal processing circuit of the door assembly of FIG. 19; and FIGS. 20(a) and (b) show examples of an optional handle which is illuminated that may form part of the door assembly.

Figure 1:
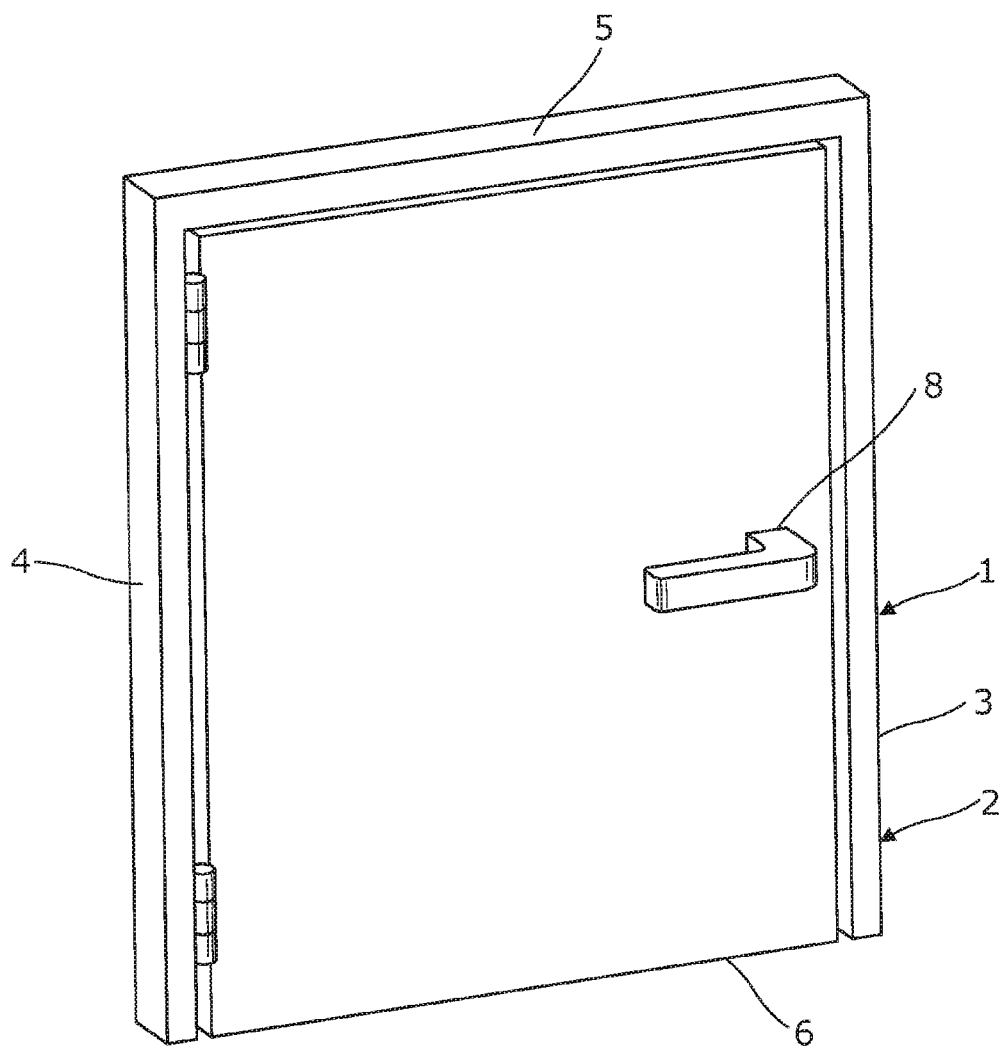
FIG. 1 is an illustration of the basic parts of an MRI room door that falls within the scope of the present invention
Figure 2:
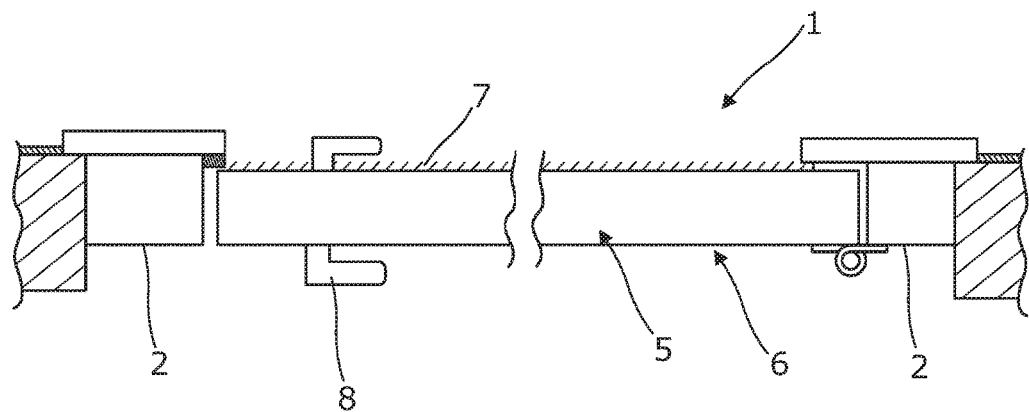
FIG. 2 shows the door of FIG. 1 from above when in place at an entrance to an MRI room, again with the safety system not shown.

Referring to FIGS. 1 and 2 of the accompanying drawings, the basic components a doorway assembly 1 for an MRI room is shown. This example shows a door which is side hinged and which opens out from the room, but the skilled reader will understand that other types of door can be provided within the scope of the invention. For instance, a door may be provided which hinges into the MRI room or which can be slid from side to side in order to open and close the door.

The door assembly 1 comprises a door frame 2 which has two uprights 3,4, a top bar 5 and a bottom plate 9. The uprights and top bar comprise steel sheets that are pressed into the shape of a hollow box section. Within the frame 2 is a door 6, which is provided with an RF shield 7 on the side that in use will face into the MRI room.

The door is a solid door, although it will typically comprise an internal frame and opposing face panels secured to the inner frame. On one side, typically the side that will face into the MRI room, the door is covered with a protective RF shield 7 that ensures that RF radiation cannot pass through the door. The shield extends to the edges of the door that contact the door frame.

The door assembly also includes a door handle 8 fitted to the door. The handle operates a latch (not shown) built into the frame upright 3 which can enter a keep (also not shown) provided in the door 6. In other arrangements the latch may be provided in the door and the keep in the frame.

To open the door the operator turns the handle 8. This releases the latch from the keep and the door can then be opened.

In a position of use, the frame is fitted into an opening of corresponding size in the wall of an MRI room. The frame, being of electrically conductive material, is fixed to the RF shielding provided in the wall of the room to prevent the leakage of RF radiation between the frame and the wall. When closed, the RF screening of the door is electrically connected to the frame, so that no leakage occurs between the door and the frame.

The door assembly of FIGS. 1 and 2 includes at least one safety system. This is omitted from FIGS. 1 and 2 to better explain the key features of the door and frame. A number of different safety systems are envisaged and the following are merely examples of possible arrangements of safety systems that could be provided.

Figure 3:
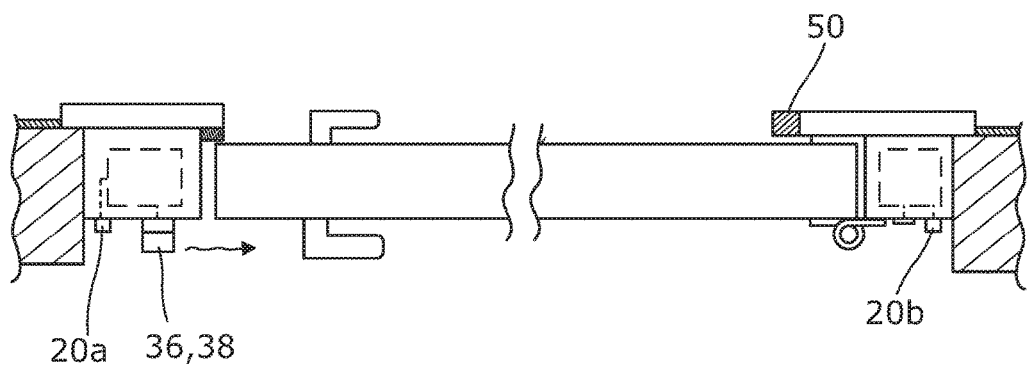
FIG. 3 is a view corresponding to FIG. 2 with the sensors of a first embodiment of a safety system shown.
Figure 8:
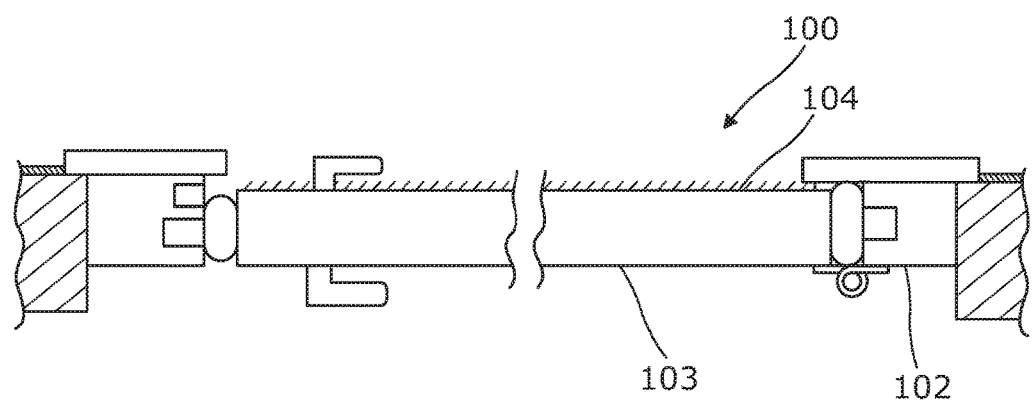
FIG. 8 is a view of the door of FIG. 7 from above.
Figure 4:
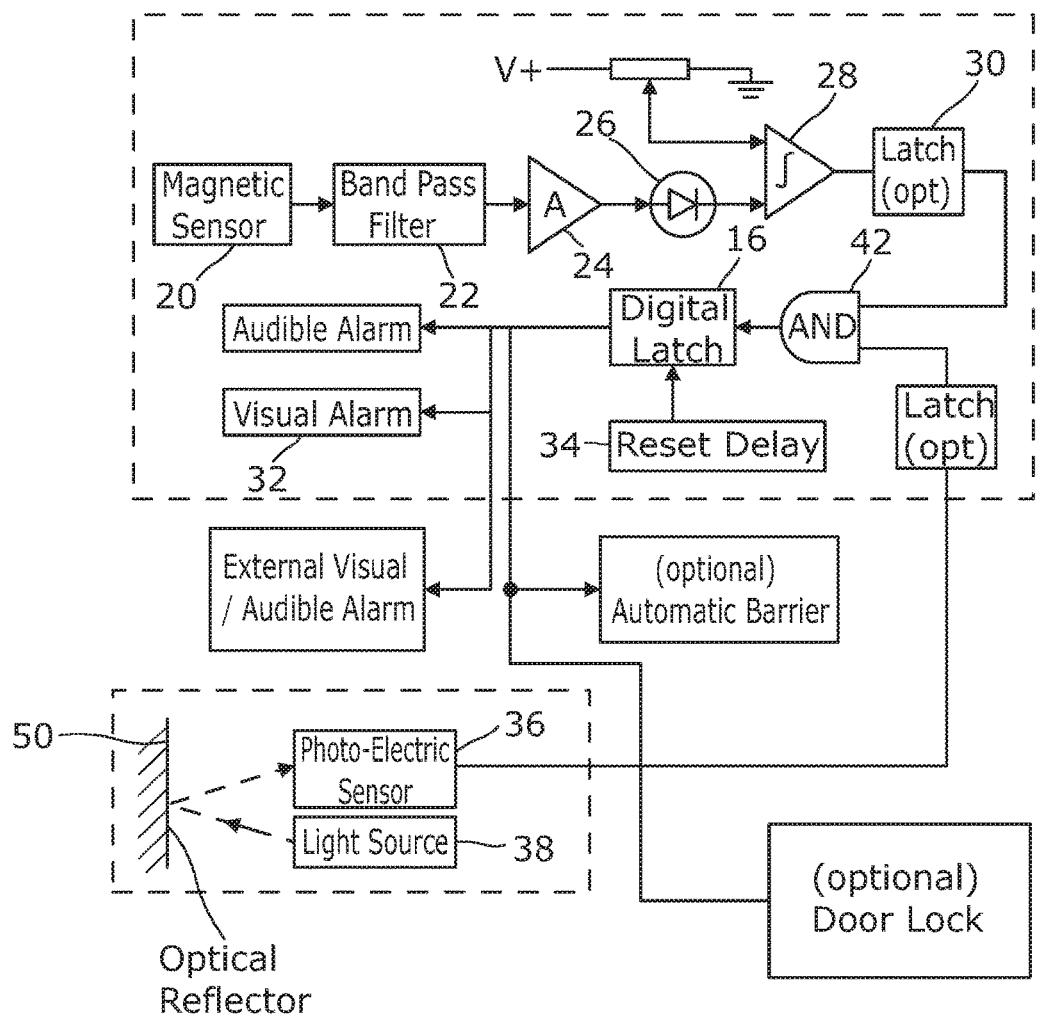
FIG. 4 is a detailed schematic of a suitable arrangement of the circuit of the FMDS of the embodiments of FIG. 3.

A first embodiment of a door assembly include a safety system is shown in FIGS. 3 and 4. The safety system comprises a ferromagnetic detection system (FMDS) that is built into the door assembly. Previously, FMDS systems have only been available for installation around a door assembly onto the adjacent walls.

The ferromagnetic detection apparatus in this example uses analogue circuitry and is shown schematically in FIG. 4. The skilled person will understand that the circuitry could be implemented using digital processing circuitry in the form of a microprocessor, a memory and some processing instructions stored in the memory that tell the microprocessor how to process input signals from various sensors and what signals to output.

The basic FMDS shown in FIGS. 3 and 4 includes a primary magnetic sensing apparatus comprising a magnetic sensor 20, such as a fluxgate sensor, a magneto-resistive sensor, a magneto-impedance sensor, a Hall Effect sensor, or a galvanic coil sensor, that outputs a signal that is a measurement of the magnetic field incident upon the sensor 20. Sensor 20 may be an arrangement of more than one sub-sensor such as a balanced pair or an array of magnetometers or gradiometers. It also includes some non-magnetic sensors 36 and 37 as will be explained.

As shown in FIG. 3 the magnetic sensor comprises two sensors 20a, 20b, each embedded into a respective door frame upright. The sensors will register a largely unchanging magnetic field due to the earth or where the door is an entryway to and MRI machine, the combination of the earth's magnetic field with the fringe field of the MRI's magnet. This constitutes a large offset on the output of the sensor. This constant offset can be removed using a high pass filter. The sensor will also likely measure regular changes in the magnetic field associated with the power supply for electrical equipment located near the doorway which will cause the output to vary at the supply frequency and its harmonics. This can also be filtered out using a low pass filter. The filters collectively constitute a band-pass filter 22 to perform these functions.

It is known that it takes between 0.3 seconds and 3 seconds, typically, for a person to pass through a doorway. The reciprocal of these times defines the frequencies of interest in the output of the sensor 4, i.e. 0.3 to 3 Hz.

If a ferromagnetic object carried, or pulled or pushed, by a person passes close to the sensors 20, the ambient magnetic field will be altered causing a change in the output of the sensors 20. That change will pass through the filter 22 and be amplified by an amplifier 24. In order to trigger an alarm the signal size is compared with a preset threshold. Because the signal may be positive or negative, the threshold detector consists of a rectification stage 26 followed by a comparator 28 that has a circuit to provide a threshold voltage. An optional latch 30 may be provided which holds the value of the signal output from the comparator for a predetermined period—perhaps up to 1 second.

A visual warning, such a light source 32 of the magnitude of the magnetic signal may be included. For instance, a series of amber light "bars" may be provided which are illuminated sequentially as the output signal increases in strength up to the threshold, and once the threshold is reached a red light may be illuminated. As shown in FIG. 6 this is built into the top bar of the frame, but it could preferably be built into the uprights or into the door at eye level. The output of the comparator may be arranged to have logic level zero for the state where the signal does not exceed the threshold, and level 'one' for the state when the signal has exceeded the threshold. Once an object has passed out of range of the sensor 20 the logic level returns to zero once the signal level has dropped below the threshold. In practice, it may be preferable that the alarm continues for an elapsed time defined by a reset delay 34 and a latch 16 such as a flip-flop that maintains the output at logic one until the pre-set time has elapsed.

The latch is used to trigger one or more warning devices such as an audible alarm 34 and the visual alarm 32. It has been found to be beneficial, although not essential, that both a visual and audible alarm is provided.

To reduce false alarms, the apparatus further includes a secondary, complimentary, non-magnetic sensing apparatus that senses when a person passes through the doorway. The secondary sensor apparatus may take several forms and in its simplest may comprises one sensor 36. The sensor comprises a non-magnetic sensor having a distinct zone of protection within which it will detect. The zones should, of course, lie at least in part within the region over which the primary sensing apparatus is sensitive to ferrous objects.

In the example of the first embodiment each the non-magnetic sensors 36 comprises a photo-electric sensor (or any other device that is sensitive to incident light) which is arranged to detect when a person, or other object, passes through a beam of light directed at the sensor. The light beam may be visible or invisible. The beam of light is generated by a light source 38, such as an LED, associated with the photo detector 36.

If the beam is unbroken, the output of the sensor 36 is a logical zero and if it is broken by movement of an object into the path of the beam, the output changes to a logical one level. Of course, the logic could be reversed in an alternative embodiment. The output of each sensor may be held for a period, say up to 1 second, using a latch (not shown).

The output of the sensor 36 is fed to one input of an AND gate 42 whose output is fed to the digital latch 16. The other input of the AND gate 42 is fed with the output of the magnetic sensor comparator 28. The AND gate, in use, performs a correlation function between the magnetic and non-magnetic sensor means. The AND gate and latch together define a signal processing circuit and can be considered to provide an output whose value is dependent on a correlation between the outputs of the primary and secondary sensor apparatus.

Figure 5:
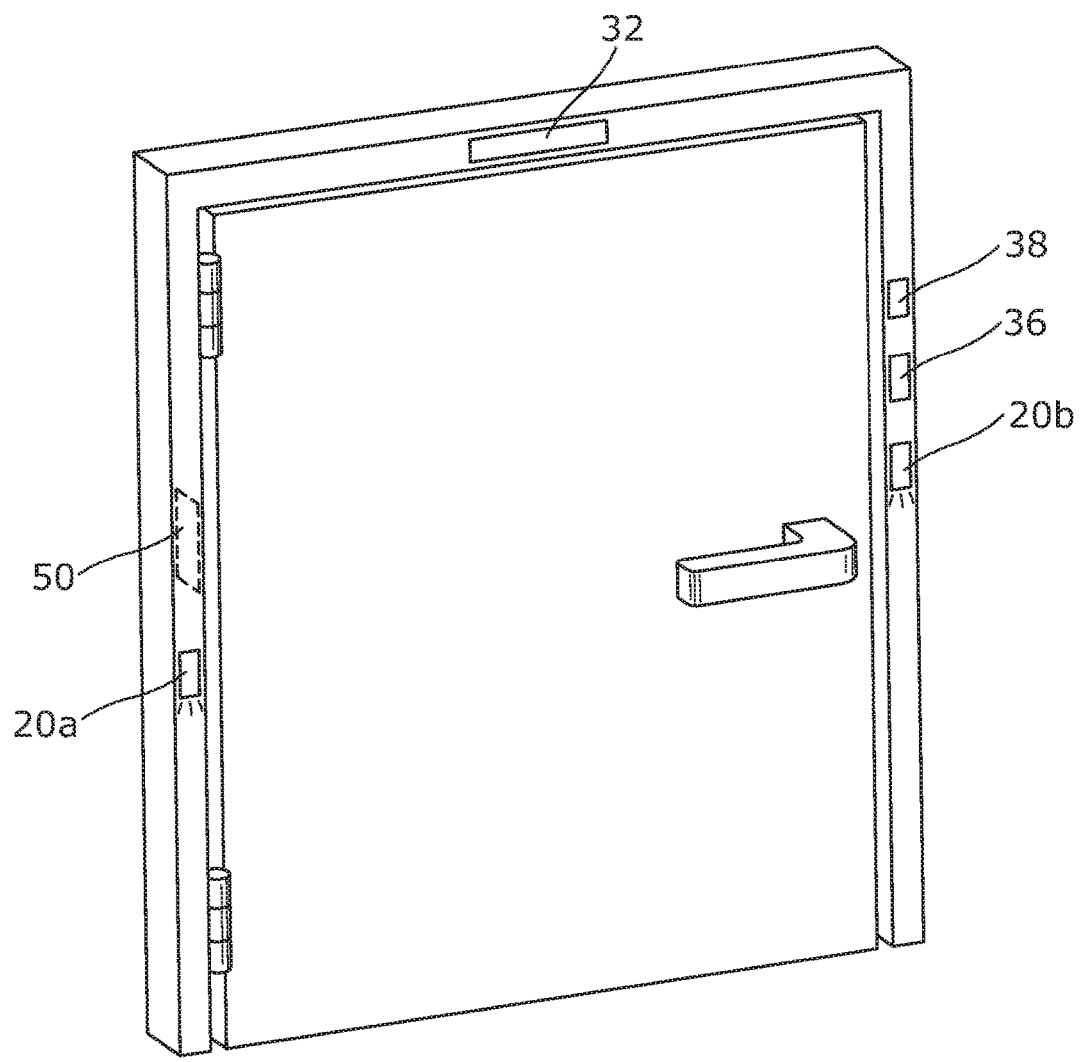
FIG. 5 is a view corresponding to FIG. 1 showing the location of parts of the sensors of the embodiment of FIGS. 3 and 4.

The FMDS apparatus shown in FIGS. 3 to 5 protects the doorway, raising an alarm if a ferromagnetic object moves towards the doorway. Where the door opens into the MRI room the light source and detector may be located on the outside of the door assembly so that he beam passes across the front of the door. If the door opens out form the room this will not work as the door, when open, will block the beam. The sensor and light source could therefore be located inside of the room, on the other side of the door frame. However, this may not always be acceptable and so, as shown in FIGS. 3 and 5 the light source and detector may be located outside of the room and a reflector may be located inside of the room. The detector will then see the beam whenever the door is open.

Whenever the light beam is arranged as shown in FIG. 3, a means for detecting that the door is closed should be provided. This ensures false alarms are not made when the door is closed, as the light beam will be broken at this time.

One example of a suitable arrangement for a beam and door sensor that achieves the required correlation of outputs is shown in FIG. 6. As can be seen, the apparatus is arranged so that the light source and photo-detector are located outside of the room and the beam produced by the light source shines across the doorway to strike a respective patch of retro reflective material 50 located on an opposing side of the doorway. The patch 50 is located in a fixed position inside the room. The use of the reflective patch allows the sensor 36 to be located adjacent its respective light source 38 on the outside of the door frame. Retro reflective patches are also easier to align than pure reflectors, and so make installation simpler compared with the use of ideal mirrored reflectors. Such retro reflectors are well known in the art and so will not be described here in detail, typically comprising an array of small corner-cube to direct a beam of light incident upon them back to where it came from.

The beam lies in the horizontal plane, at around waist height or lower. It could, if preferred, be inclined from the horizontal. The important point is that the beam must extend from one side of the doorway to the other, i.e. from the left to the right side of the door, to give full protection against objects trying to pass through the door.

Figure 6A:
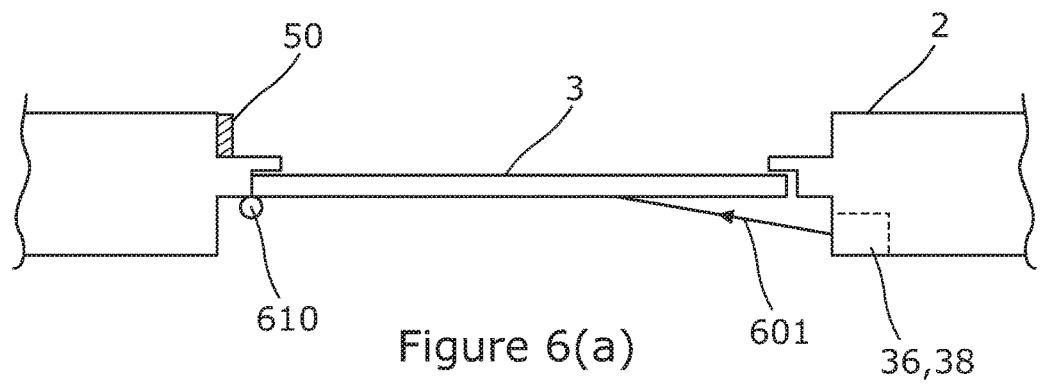
FIG. 6 shows the movement of the door of FIG. 5 from closed to open and a person passing through the door assembly.
Figure 6B:
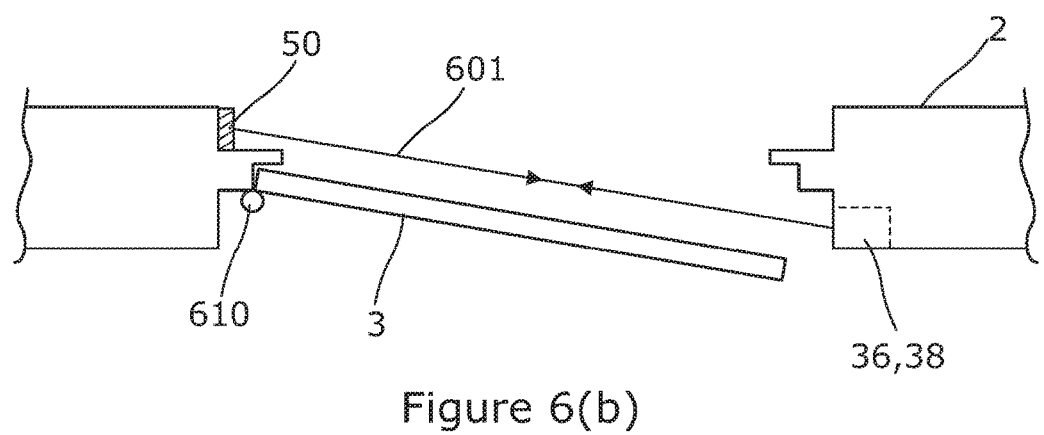

When the door is closed, as shown in FIG. 6(a) the beam 601 that should be reflected from the retro reflective patch inside the room is broken. When the door is open past the point where the beam is 601 made, as shown in FIG. 6(b) the beam that is reflected from the patch inside the room is then clear of the door and so that beam is no longer broken.

Figure 6C:
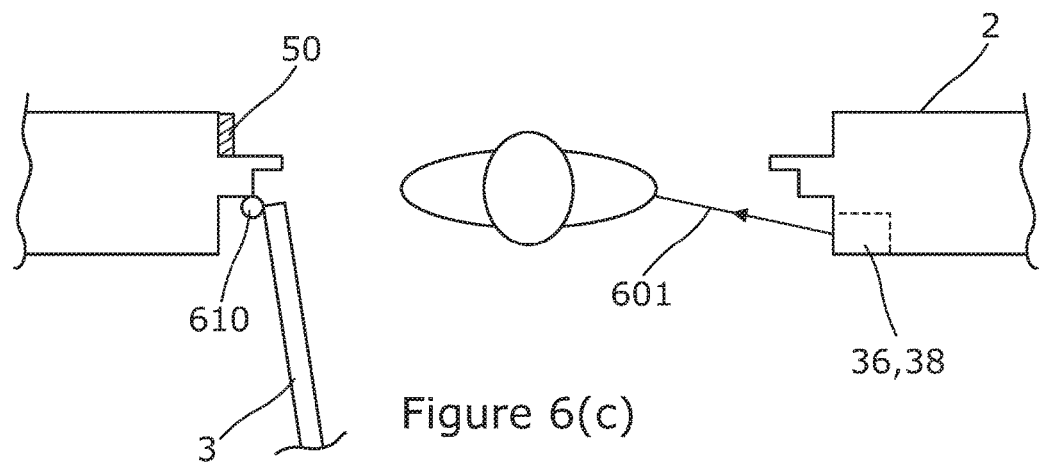

The output of the light detector is correlated with the output of the door position sensor 610, so that an alarm can only be raised if the door is open and the light beam 601 is broken as shown in FIG. 6(c).

Because the sensors are built into the door frame during assembly, care can be taken to ensure that they are correctly aligned. Then, when the door assembly is installed the sensors will automatically be in the correct positions and alignment.

The sensors may be built into the surface of the door frame as shown in FIGS. 3 and 5. The processing circuitry (essentially everything apart from the exposed parts of the sensors) may also be located within the door frame or perhaps within the door. In each case the circuitry should be located outside of the RF shield, i.e. on the side of the shield facing away from the MRI room.

Figure 7:
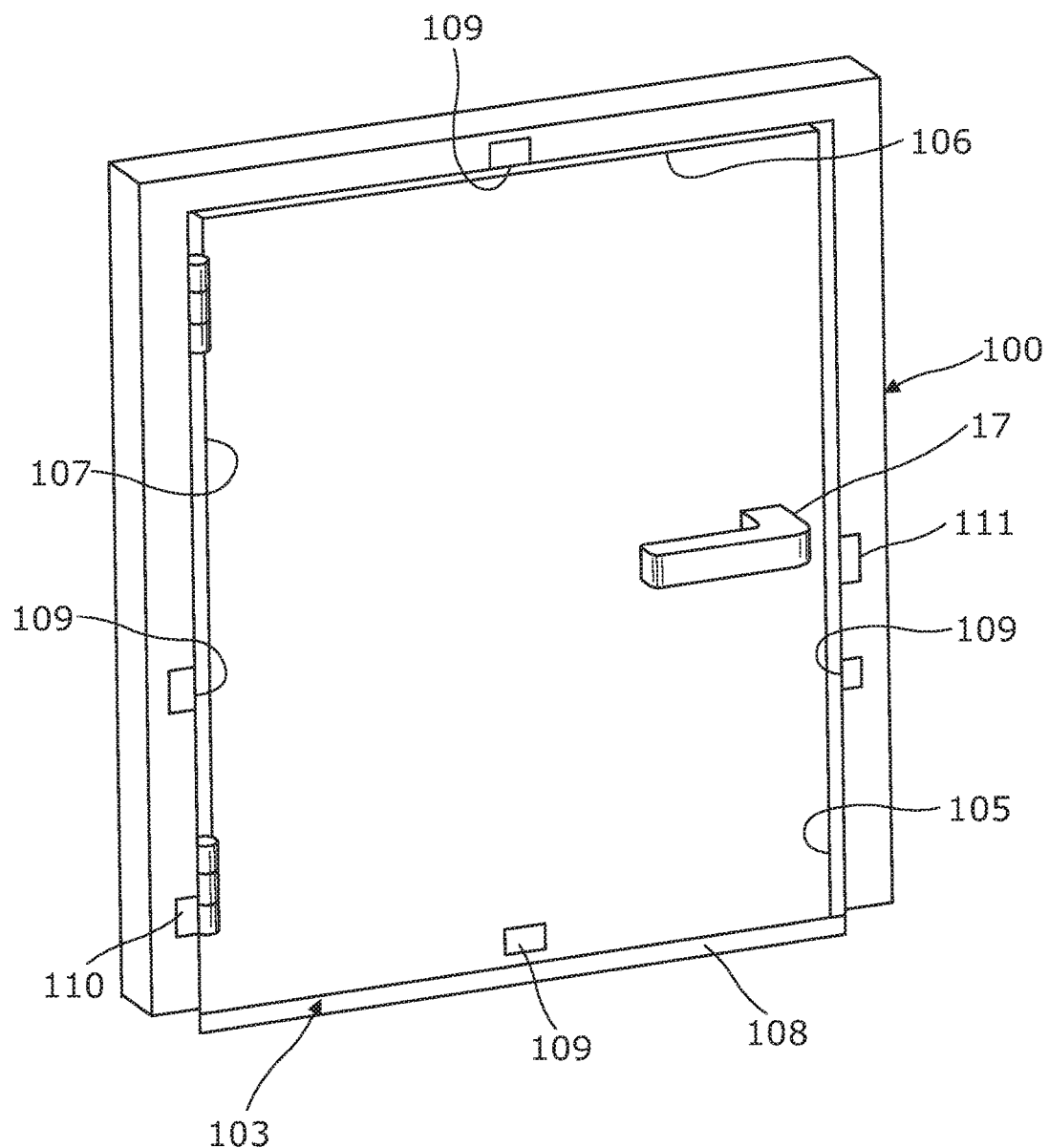
FIG. 7 is an illustration of a more complex MRI room door which includes an automatic RF seal.

The skilled person will also understand that the door assembly may include an automatic RF seal between the door and the door frame. FIG. 7 shows a door assembly 100 of that type. The door assembly comprises a door frame 102 which has two uprights and a top cross piece and a base plate. The uprights and top bar may comprise metal sheets that are formed into the shape of a hollow box section. Within the frame 102 is a door 103, which is provided with an RF shield 104.

The automatic seal is controlled by circuitry that is typically located in the door frame but could be located some distance away from the door. The circuit receives power from a remote power source (not shown) such as a mains electricity supply. In the example shown the automatic seal comprises four elongate conductive metal bars 105, 106, 107 and 108, one each side of the door between the door and uprights of the frame, one at the top of the door between the door and top bar of the frame and one at the bottom of the door between the door and a conductive metal plate fixed to the floor. These are movable by actuators 109. As shown the actuators 109 are built into the door frame and is use push the bars into contact with the edge of the door when the door is closed.

To move the actuators 109, the circuitry receives a signal from a door release mechanism sensor 111. This may be provided in the door frame and provides an indirect indication of the position of a door handle 17 fitted to the door by monitoring the door latch operated by the door handle. The circuit for the seal implements processing logic to determine whether to close the seal, pressing it into the contact with the door frame, or to release it. When closed, the seal electrically connects the door to the conductive frame. The frame in turn is connected electrically to an RF shield that extends around the MRI room. With the seal closed the door cannot easily be opened.

To open the door the operator turns the handle 111. This is sensed by the circuit, which moves the actuators to break the seal. The door can then be opened. As shown the door is a hinged door supported by hinges and opens outwards from the MRI room. The door could open inwards in other arrangements and this is therefore not to be seen as limiting to the invention.

The applicant has appreciated that the door release mechanism can be used by and FMDS to help reduce the instances in which false alarms are raised by movement of the door itself.

Figure 9:
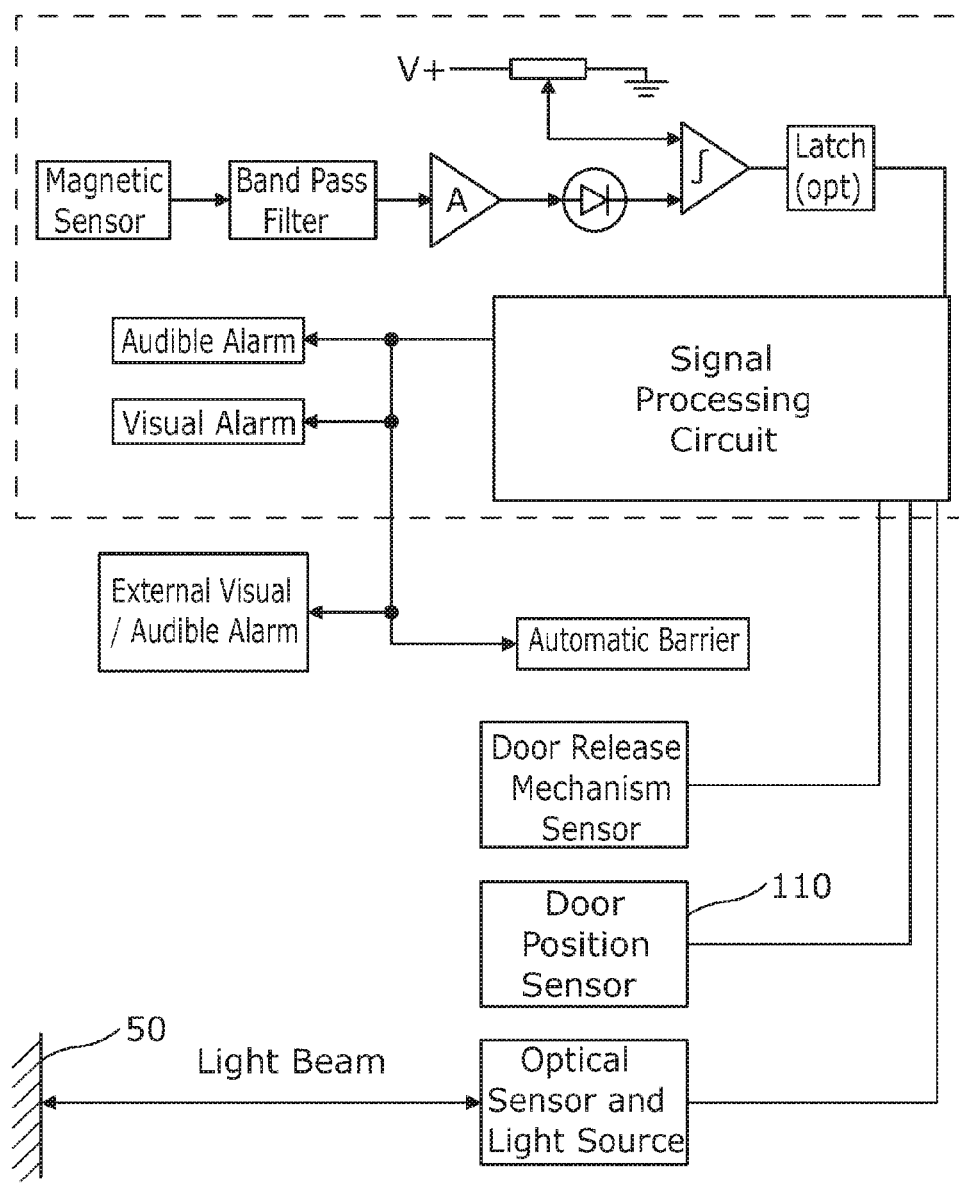
FIG. 9 is a schematic of an embodiment of an FMDS safety system that can be fitted to the door assembly of FIGS. 7 and 8 and which falls within the scope of one aspect of the invention.

For example, FIG. 9 shows an arrangement in which a door assembly is provided with a safety system comprising an FMDS which uses the signals from the door release mechanism sensor. Where parts are the same as for the first embodiment of an FMDS the same reference numerals have been used for clarity and the corresponding description of those parts applies.

The FMDS of FIG. 9 comprises a digital system where the latch output of the magnetic sensor is fed into a signal processing circuit. The circuit includes a processor and a memory which optionally stores program instructions but can also store historical data from the magnetic sensor along with time stamps indicating when the data was obtained. The data is stored in the memory as first in last out data, so the memory always holds historical data over a window of time of set length. For example, if the magnetic sensor data is sampled once every millisecond and 1000 samples are stored the data will correspond to a historic window going back in time for 1 second.

The door position sensor 110 produces an output signal indicative of the angular position of the door. The output of this sensor 110 is fed into the signal processing circuit which processes the signal to determine the position of the door at a given time and also whether the door is moving or stationary. In this example it does so by comparing the position at the given moment in time with the position shortly prior to this.

Figure 10:
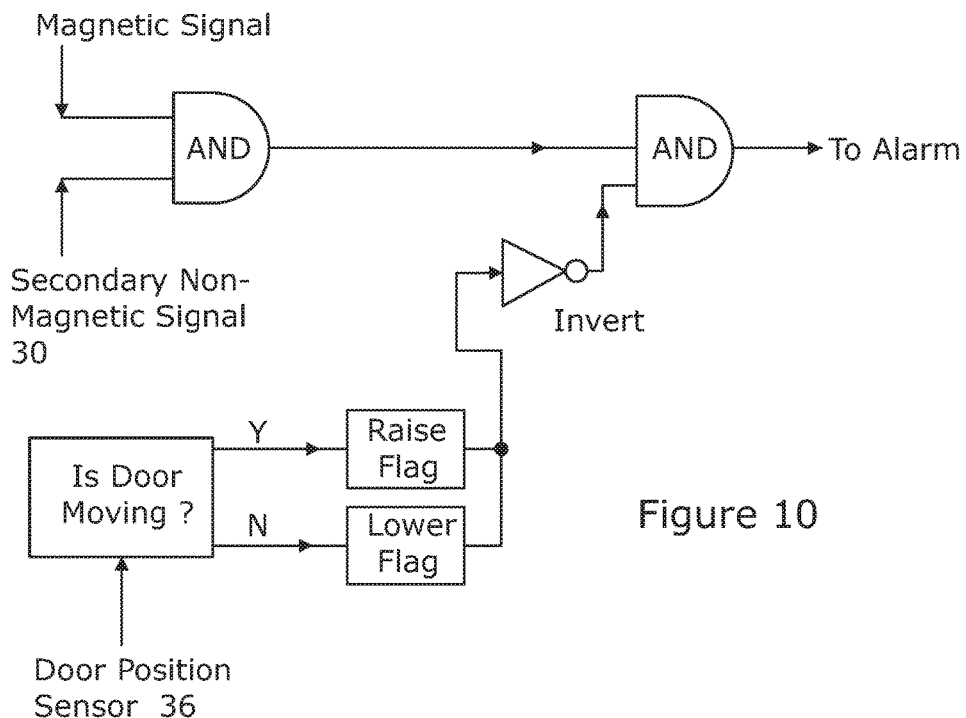
FIG. 10 is a schematic of the logic applied by the processor of FIG. 9.

The signal processing circuit performs a logic function as shown in FIG. 10 and generates a door moving signal with a logical high value if the door is moving and logical low value if it is still. This is then combined with the output of the latch using a logical AND gate to provide a signal that is fed to the alarm device. The alarm is therefore raised if the latch output is high, indicating that a ferromagnetic object has broken the beam of the photoelectric sensor, but is suppressed if the door is moving.

Suppressing the alarm if the door is moving allows the apparatus to be used with ferromagnetic doors which might otherwise cause false alarms as they move. However, this would also suppress a real alarm if a ferromagnetic object was to pass in whilst the door is moving. To avoid this potentially dangerous situation the FMDS needs to determine whether a dangerous object was present just prior to the door opening.

Figure 11:
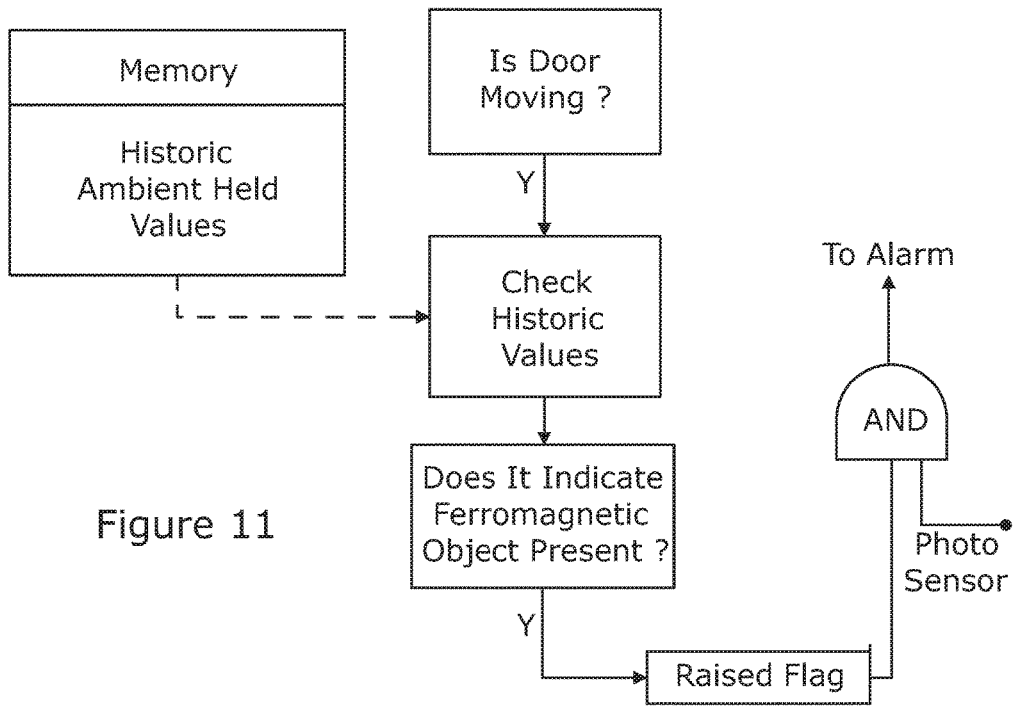
FIG. 11 is a schematic of alternative logic that can be applied by a modified version of the FMDS shown in FIG. 9.

To do this the apparatus includes a memory which stores historical ambient magnetic field information from the magnetic sensor. The signal processing circuit, as shown in FIG. 11, upon the door moving signal going high to indicate that the door has started to move, stops using the output of the magnetic field sensor for the current time as the basis for detecting the presence of a ferromagnetic object moving in the zone of sensitivity and instead looks at historical values stored in the memory prior to the door moving signal going high. If this provides an indication that a ferromagnetic object was moving in the zone of sensitivity just before the door moved, the circuit will then override the logical high value of the door moving signal so that the alarm is no longer suppressed, the alarm instead being raised.

By looking at the historical data, the alarm can remain active but the effect of the moving door on the operation of the alarm is removed because the apparatus relies instead on the information obtained prior to the door moving.

Figure 12:
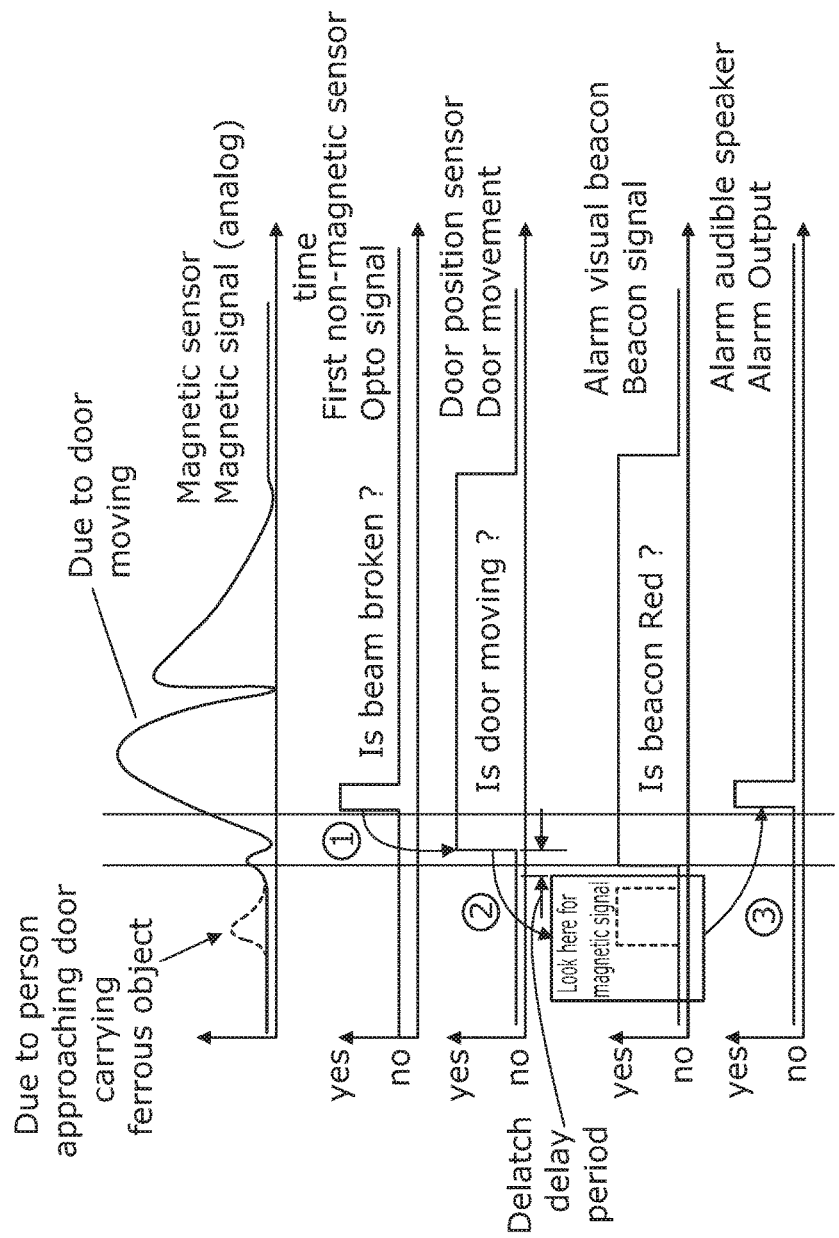
FIG. 12 is a plot of various sensor outputs and logical signals from the signal processor of FIG. 11 as a person approaches and then opens the door of FIG. 7 while carrying a ferro-magnetic object.

FIG. 12 illustrates the signals from the magnetic sensor, the optical beam, and the door position sensor when a ferromagnetic object approaches a door that then starts to move, as would be the case where a person carrying the object approaches the door and then pushes it open.

In this case, the process is triggered when the beam across the door is broken. As can be seen, the signal processing circuit detects whether the door is moving, and if so it looks back in time at the magnetic signal before the door started to move. If this indicates that a ferromagnetic object was moving in the detection zone of the magnetic sensor as shown the alarm condition is raised.

In a further modification, the signal processor may use the output of the door release mechanism sensor to trigger the end of the time period for historical data. This will move the time at which the processor starts to look back to see if a magnetic object was present back in time compared with using the actual start of movement of the door as the trigger. This is because there is often a slight time delay between a user grabbing the door handle and the door actually being pulled open, or pressing the door release button (where provided) and then opening the door.

During the time after the door release mechanism is triggered there will often be some change in the magnetic field as the seals move (where provided) or as the door handle is moved. Moving the time back allows the time period at which the check for ferromagnetic objects is made to be moved away from the time when these anomalous signals occur. This makes the check more reliable, and can allow a lower threshold to be used. For instance, it can be seen in FIG. 11 that without this a slight delay to allow for the door handle and delatch operation has to be incorporated into the processing, and this can only be an estimate of the time delay between starting to delatch the door and the door actually moving.

The skilled person will understand that any of the features of these embodiments can be introduced into any other embodiment. For instance, the door moving suppression can be implemented in conjunction with the second optical beam to suppress the alarm as an object leaves a room.

It should also be understood that the simplified discrete logic circuits that have been illustrated are not to be construed as limiting. An almost limitless set of possible digital circuits could be readily implemented that achieve the same overall logical function, using combination of OR, AND, NOR, NAND and XOR gates, either as discrete elements or as logical steps in a computer implemented program executed on digital processing device.

Figure 13:
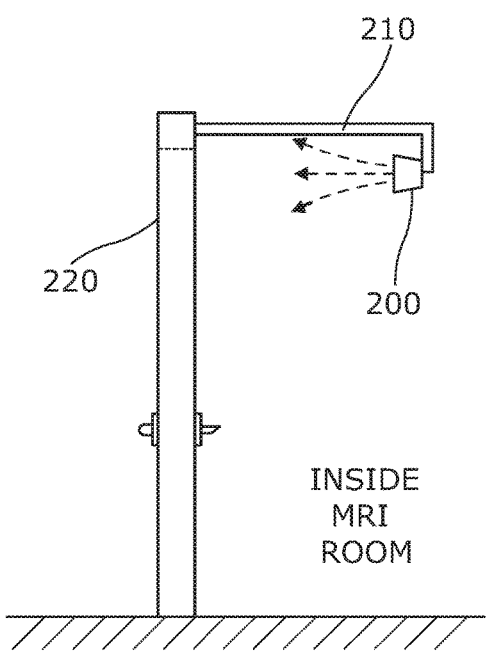
FIG. 13 is a view of an alternative configuration of a warning light for use in an FMDS system.

FIG. 13 shows a modification to an FMDS system. In this modification, a light 200 which provides a warning signal is supported on the end of a boom 210 that is fixed to the door frame 220 of an MRI door assembly on the side of the frame that will face into the MRI room. The boom 210 extends into the room so that the light source 200 faces a person entering the room. This location for the light source makes it easier for the person to see the warning issued by the light source 200 if they have approached the doorway at speed when the door is open. Of course the light does not need to be at the end of the boom, and could be located at any position along the boom as long as it is spaced apart from the door frame.

Figure 14:
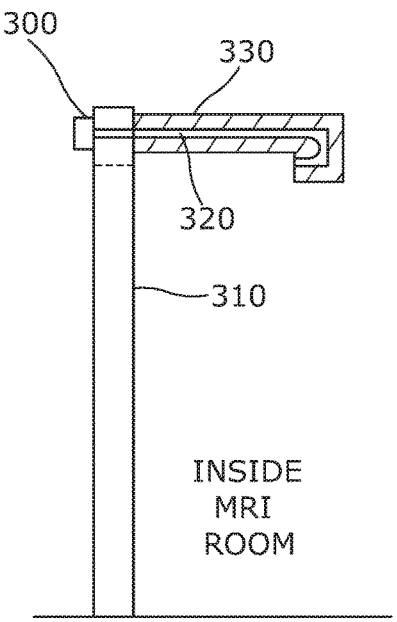
FIG. 14 is a view of a further alternative configuration of a warning light for use in an FMDS system.

FIG. 14 shows a modification in which a light source 300 is not located at the end of the boom. Instead the light source is secured to, or built into, the door frame 310. The source emits light that is transmitted along an optical fiber bundle 320 within a boom 330 that extends away from the door frame into the MRI room. The light exits the fiber bundle 320 in a direction facing the door frame. This may be advantageous compared with the light being on the end of the boom because the light source, and the circuitry associated with it, can be located on the side of the RF shield that faces away from the MRI room.

Figure 15:
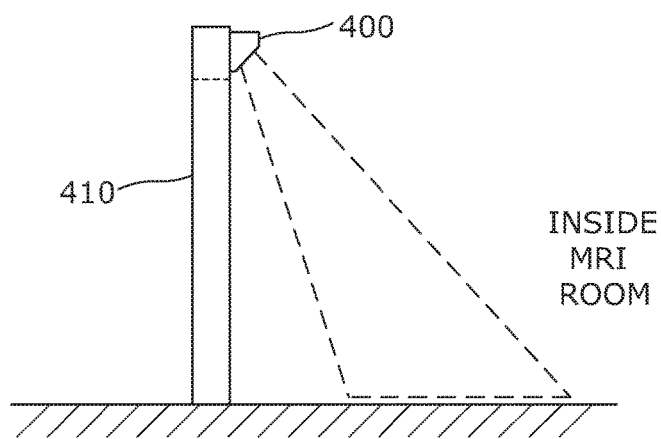
FIG. 15 is a view of a projector that can be used to provide a visual warning in an FMDS system.

In a still further arrangement shown in FIG. 15, the light source that emits the warning signal comprises a projector 400. As shown this is fitted to the door frame 410 but it could be fixed to the wall of the MRI room. The projector 400 emits an image onto the floor of the MRI room inside the room that can be easily seen by a person entering the room. The image can be changed to give a warning such as "Stop" when the FMDS detects the presence of a ferromagnetic object in the vicinity of the door.

Figure 20B:
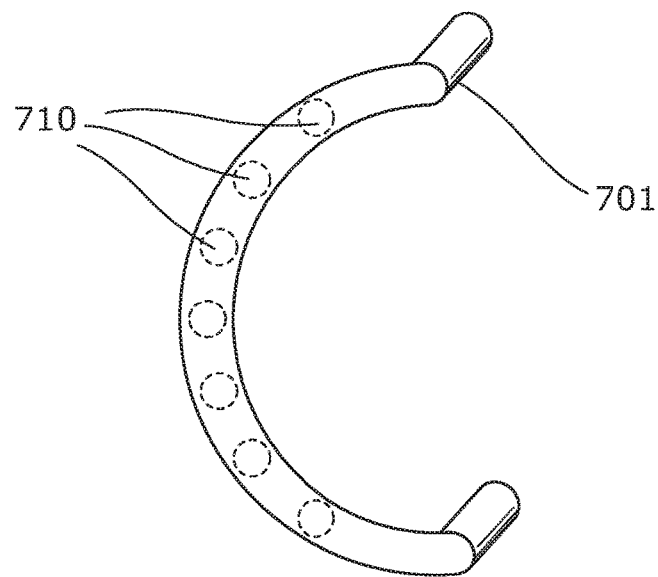

In yet another arrangement shown in FIG. 20, the door handle 700 may be illuminated by a light source 710 to provide a visual warning. As shown in FIG. 20(a) the source comprises a ring of light emitting diodes that surround the base of the handle and can emit different colored signals as a warning. For example, the lights may illuminate the handle or area around the handle with red light as a warning. In another arrangement, FIG. 20(b) the lights may be embedded within a partially transparent handle so the handle itself appears to glow as a warning.

In other arrangements, a safety system could be built into the door assembly that is not an FMDS. These other safety systems could be used where an FMDS is fitted or may be used without an FMDS being fitted to the door assembly.

Figure 16:
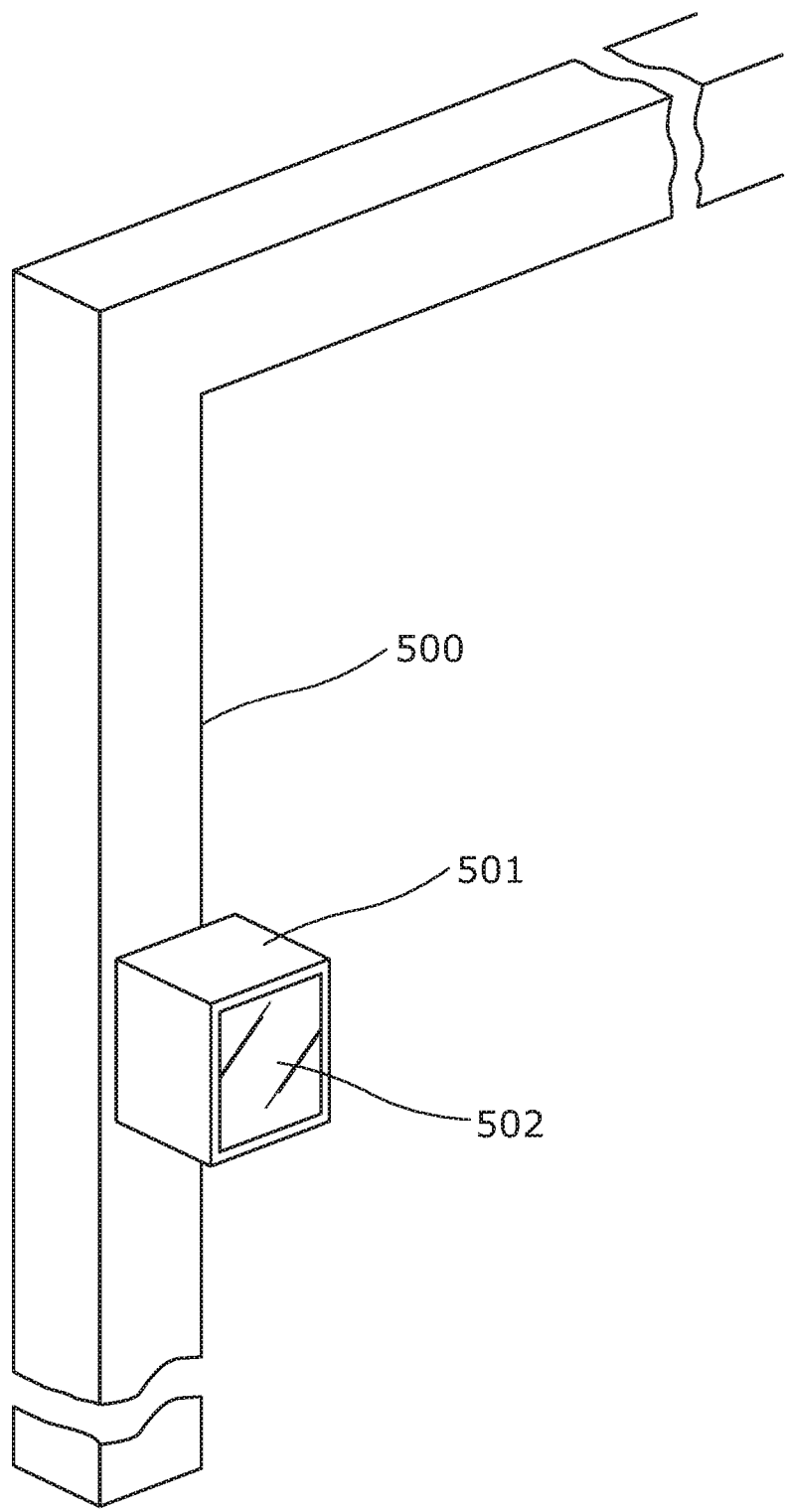
FIG. 16 is a view of a storage box that forms an embodiment of a safety system that can be integrated into an MRI door assembly in accordance with one aspect of the invention.

As shown in FIG. 16, a safety system is provided which comprises a storage box 501. The inside of the box is large enough to store the keys of a person who has entered the room, such as a patient who will be placed in the MRI machine. For instance, it may have a space of height 10 cm, width 10 cm and depth 10 cm. The box is covered with a lockable lid 502 which is transparent so that contents can be viewed by the patient at all times. It may have a hook (not shown) to hang a locker key. The box is secured to the door frame 500 of an MRI door but could be recessed into the door frame for a more integrated look.

Figure 17A:
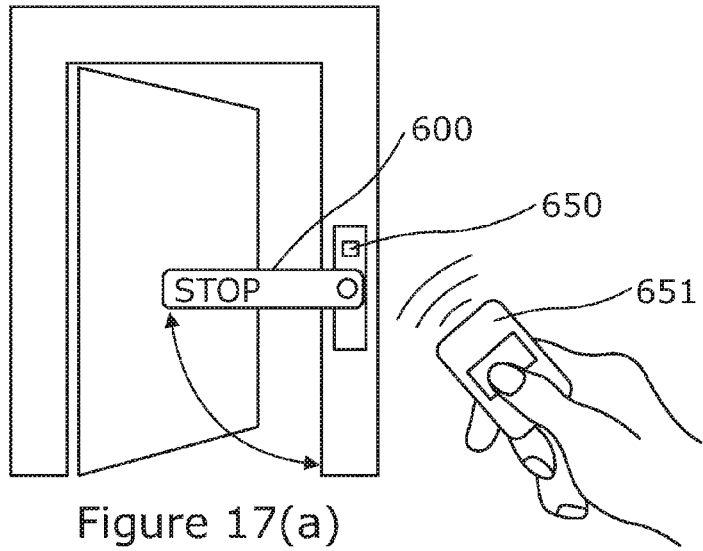
Figure 17B:
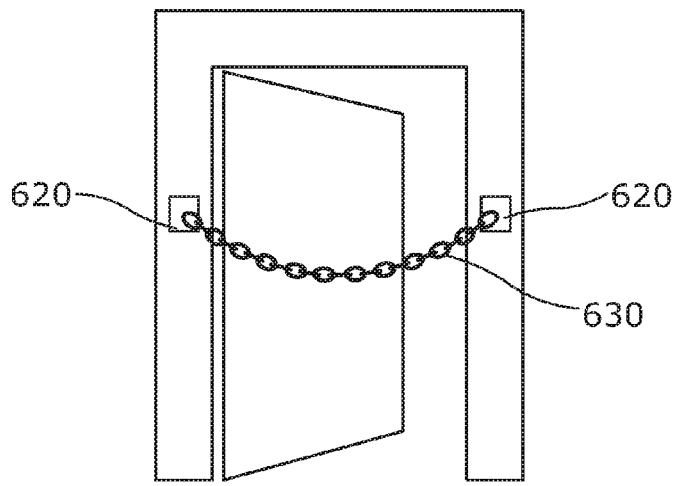
Figure 17C:
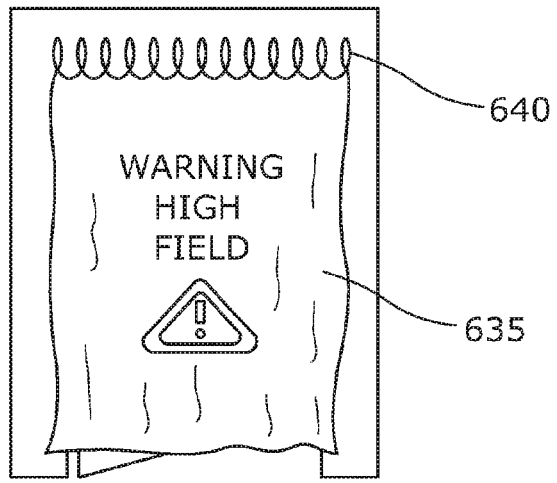
Figure 17D:
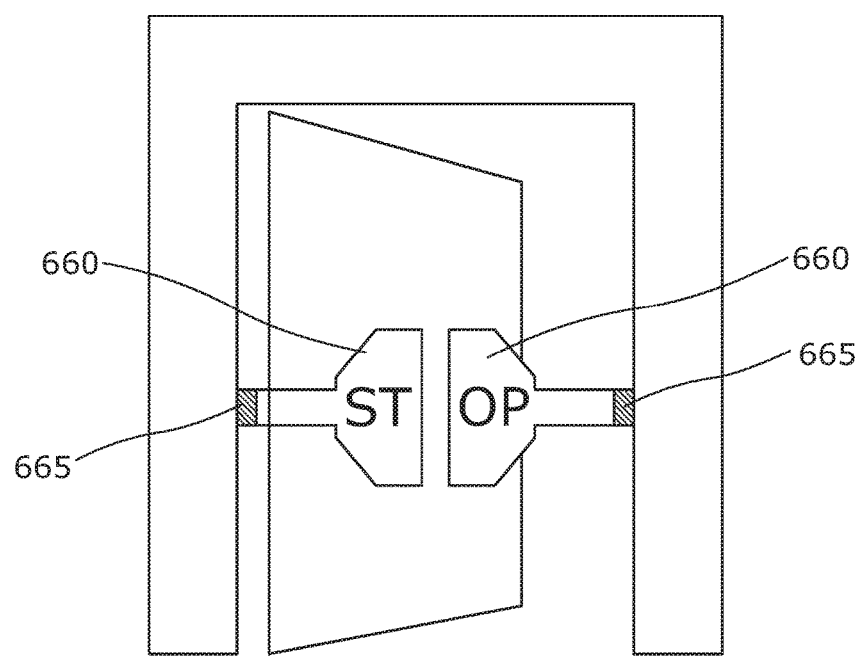

In a still further arrangement shown in FIGS. 17a to 17d, various barriers or safety warnings may be built into the door frame. FIG. 17a shows a swing barrier 600 that is operable with a button 650 and/or with a remote control 651. FIG. 17b shows a chain 630 that releasably clips onto hooks 620 formed on the frame of the MRI door. FIG. 17(c) shows a curtain 635 that also clips onto hooks 640 that are formed on the frame. FIG. 17 (d) shows a sprung saloon-door style warning sign 660 with sprung hinges 665 that allows the signs to swing inwards and outwards, but rests in the position shown across the door threshold.

In a still further arrangement, shown in FIG. 18, the safety system may comprise an RF detector that is linked to an FMDS to modify the alarm depending on the identify of tags within the range of the RF tag detector. A memory may store a list of "safe tags" and if such a tag is detected the alarm may be modified. The RF tag detector may be built into the door assembly, for instance into the frame as shown.

The RF tag detector takes the form of an RF identification tag reader, and a memory which identities of known RFID tags associated with the apparatus may be stored, The FMDS may take the form shown in FIG. 10 but with some modifications to the logical operation of the signal processing circuit as shown in FIG. 19. The apparatus is intended to be used along with a number of RFID tags, and these may be supplied along with the apparatus.

RFID readers are well known in the art and as such will not be described in detail here. Suffice that the reader is arranged to provide as an output a digital signal providing an identity of any RFID tag that is detected within a zone of detection. For optimal operation this zone should extend across a region that is further away from the doorway that the first beam, and at least overlaps with the zone of sensitivity of the magnetic sensor. Ideally, the range of detection of the reader should be quite low, perhaps only a few tens of centimeters around the doorway, so as to only read tags that are close to the doorway.

Before the apparatus is used, the memory is loaded with the identities of the tags that are supplied with the system. For this example, there are two RFID tags and the memory stores the two Identities of the tags. These may be loaded into the memory by placing the apparatus into a learning mode, and moving each tag in turn into range of the reader. Optionally the apparatus may not have a memory for tags, and just rely on the detection of tags rather than specifically reading their identification.

In use, upon an object entering the range of the RFID tag reader, the identity of the tag will be output from the reader and fed to the signal processing circuit. The circuit compares the tag with the identities in the memory. If there is a match a flag is raised (moved from logic low to logic high value) to indicate that one of the known tags is near to the doorway. The alarm is then raised or suppressed according to the correlation of the output signals from the magnetic sensor and the photodetector in the same manner described for the first embodiment. The alarm signal is then fed to an AND gate along with the inverted value of the flag so that the alarm is suppressed if a known RFID tag has been detected.

The applicant believes that this system may help remove unhelpful alarms caused by operators passing through the doorway with ferromagnetic objects but who can be trusted to only have done so if it is safe to do so. For instance, an operator who has been trained in when it is safe to move objects, and so can be assumed to not be taking any unsafe objects into a room, may carry an RFID tag and so never trigger the alarm. This might be desirable where the operators might be wearing underwired bras which have become magnetised, whereas otherwise they will either always trigger an alarm or be required to change their clothing.

The memory may, optionally, also store a value alongside each identity in the memory which determines a sensitivity level at which the latch will be triggered. For instance, a more trusted user may be provided with a tag which is associated with a higher threshold and a less experienced user given a tag associated with a lower threshold. Then, when a tag is identified by the circuit the level at which an alarm will be triggered can be set according to the corresponding value stored alongside it in the memory.

This later feature in particular is envisaged as useful where a tag is secured to a ferromagnetic object such as a trolley. The object will have a ferromagnetic profile as seen by the magnetic sensor when it is moved into the detection range of the magnetic sensor. In particular the profile dictates the peak change in magnetic field that is expected to be observed by the magnetic sensor due to the presence of the object. This can be used to set the threshold at which the latch triggers, so that the object alone cannot set off the alarm but the presence of any magnetic object in addition to the object will take cause the threshold to be exceeded and so an alarm may be raised.

The RF tag system could be replaced with another mechanism for identifying a person who is approaching the door assembly. For example, the use of biometric scanners, thumbprint readers and the like are all envisaged. These can all function as safety systems within an FMDS.

The invention claimed is:

1. An MRI room door assembly for use in protecting an entrance to a room containing an MRI scanner system, the assembly comprising a doorframe that is suitable of being fixed in position within or around an opening to the room, a door that is fixed to the doorframe, and a sealing arrangement that seals the door to the frame when it is at rest in the closed position and which is released as a user initiates an opening of the door, in which at least one or more of the door and the doorframe include a built in safety system which provides a function relating to preventing ferromagnetic objects being brought unintentionally close to the MRI machine, in which the safety system comprises a ferromagnetic detection system (FMDS) arranged in use to warn a person approaching the door with a ferromagnetic object that they should not enter the room through the door with the ferromagnetic object;

in which the FMDS comprises:

a primary sensor means comprising at least one passive magnetic sensor means which detects the disturbances in the ambient magnetic field which occur as the ferromagnetic object moves through the field;

a secondary non-magnetic sensor means which detects movement of objects in the vicinity of the primary sensor means; and a processing circuit which is arranged to monitor the signals from the sensors and to provide an alarm in the event that both the primary and secondary sensor means detect a moving ferromagnetic object, in which the signal processing circuit is configured to identify temporal variations in the measurement signal due to the movement of a ferromagnetic object within the ambient magnetic field and to correlate the identified temporal variations in the measurement signal with instances in which the non-magnetic sensor means detects the presence of an object in its detection zone, and in which the signal processing circuit is arranged to cause the alarm to operate in the event that the correlation is indicative of the presence of a ferromagnetic object in the primary detection zone, and further in which the signal processing circuit is adapted to determine the direction from which the object is approaching the doorway from the output signals from the non-magnetic sensor means and to modify the operation of the alarm dependent on the direction of approach.

2. The MRI room door assembly according to claim 1 in which the safety system is built into the door assembly prior to installation of the door assembly at an MRI room.

3. The MRI room door assembly according to claim 1 in which the secondary nonmagnetic sensor means comprises a photo-detector which is fitted to the outside of the door assembly, the system also including a light source fitted to the outside of the door assembly and a reflector provided on the inside of the door assembly, the photo-detector receiving a light beam from the source that has passed through the door opening when the door is open and is reflected back onto the photo-detector from the reflector, the FMDS system further comprising a door position determining means which determines when the door has opened sufficiently far to have cleared the light beam.

4. The MRI room door assembly according to claim 1 in which the FMDS comprises:
    a door position determining means which is adapted to monitor the angular position of the door relative to the entrance,
    and further comprising a memory which in use stores historical temporal variations in the measurement signal due to movement the ferromagnetic object within the ambient field, and correlation means which is adapted to correlate the stored historical temporal variations in the measurement signal prior to the door moving with incidences in which the non-magnetic sensing means detects the presence of the object in its detection zone, and in which the apparatus is arranged to raise an alarm in the event that the correlation, albeit separated in time, is indicative of the presence of a ferromagnetic object in the vicinity of the magnetic sensor.

5. The MRI room door assembly according to claim 4 which the door position determining means further comprises a user operable release mechanism, such as a door handle, push button, or keypad and a release signal sensor that indicates that a user has operated the release mechanism, in which the FMDS receives the signal from the release mechanism sensor and uses the output from the release signal sensor to determine which historical data to use in the correlation.

6. The MRI room door assembly according to claim 1 in which the safety system comprises an FMDS comprising:
    a door position determining means which is adapted to monitor the angular position of a door of the entrance, and
    in which the signal processing circuit is adapted to modify the operation of the alarm in the event that output of the door position determining means indicates that the door is moving.

7. The MRI room door assembly according to claim 1 in which the safety system comprises an FMDS comprising:
    identification means for identifying the person approaching the door, the signal processing circuit being configured to identify temporal variations in the measurement signal due to the movement of the ferromagnetic object within the ambient magnetic field and to correlate the identified temporal variations in the measurement signal with instances in which the non-magnetic sensor means detects the presence of the object in its detection zone, and in which the signal processing circuit is arranged to cause the alarm to operate in the event that the correlation is indicative of the presence of the ferromagnetic object in the primary detection zone but to modify the operation of the alarm according to the identity of the person identified by the identification means.

8. The MRI room door assembly according to claim 1 in which the safety system comprises an FMDS that is operable in a pre-screener mode, the FMDS including means for raising the sensitivity of the primary sensing means when in the pre-screener mode to permit patient screening and lowering it when in the entryway protection mode.

9. The MRI room door assembly according to claim 8 in which the safety system is arranged so that the pre-screener mode can only be activated with the door closed.

10. The MRI room door assembly according to claim 1 in which the safety system comprises a barrier which is fixed at one end to the door frame and the other end of which can be moved to a position in which it obscures at least partially the entrance to prevent entrance or egress from the MRI room.

11. The MRI room door assembly according to claim 10 in which the barrier is an automatic arm, a non-magnetic chain, a curtain or a pair of saloon-door type sprung barriers.

* * * * *

UNITED STATES PATENT AND TRADEMARK OFFICE
CERTIFICATE OF CORRECTION

PATENT NO. : 10,191,176 B2
APPLICATION NO. : 15/036745
DATED : January 29, 2019
INVENTOR(S) : M. N. Keene et al.

Page 1 of 1

It is certified that error appears in the above-identified patent and that said Letters Patent is hereby corrected as shown below:

In the Claims

| Column | Line | Error |
|---|---|---|
| 29 (Claim 4, Line 8) | 29 | "movement the" should read --movement of the-- |

Signed and Sealed this
Seventh Day of May, 2019

Andrei Iancu
*Director of the United States Patent and Trademark Office*